US012460316B2

(12) United States Patent
Wellmann

(10) Patent No.: US 12,460,316 B2
(45) Date of Patent: Nov. 4, 2025

(54) CRYSTAL GROWING UNIT FOR PRODUCING A SINGLE CRYSTAL

(71) Applicant: Friedrich-Alexander-Universität Erlangen-Nürnberg, Erlangen (DE)

(72) Inventor: Peter Wellmann, Nuremberg (DE)

(73) Assignee: Friedrich-Alexander-Universität Erlangen-Nürnberg (DE)

( * ) Notice: Subject to any disclaimer, the term of this patent is extended or adjusted under 35 U.S.C. 154(b) by 65 days.

(21) Appl. No.: 18/012,563

(22) PCT Filed: Jun. 24, 2021

(86) PCT No.: PCT/EP2021/067312
§ 371 (c)(1),
(2) Date: Dec. 22, 2022

(87) PCT Pub. No.: WO2022/002745
PCT Pub. Date: Jan. 6, 2022

(65) Prior Publication Data

US 2023/0243064 A1 Aug. 3, 2023

(30) Foreign Application Priority Data

Jul. 3, 2020 (DE) ..................... 10 2020 117 661.9

(51) Int. Cl.
*C30B 23/06* (2006.01)
*C30B 29/36* (2006.01)
*C30B 35/00* (2006.01)

(52) U.S. Cl.
CPC .............. *C30B 23/06* (2013.01); *C30B 29/36* (2013.01); *C30B 35/002* (2013.01)

(58) Field of Classification Search
CPC ......... C30B 23/02; C30B 23/06; C30B 29/36; C30B 35/002
See application file for complete search history.

(56) References Cited

U.S. PATENT DOCUMENTS

2006/0254505 A1* 11/2006 Tsvetkov ................ C30B 29/36 117/104
2011/0217224 A1* 9/2011 Nishiguchi ............. C30B 23/06 118/726
(Continued)

FOREIGN PATENT DOCUMENTS

CN 110512276 A * 11/2019 ............. C30B 15/10
CN 111188091 A 5/2020
(Continued)

OTHER PUBLICATIONS

English computer translation of CN-110512276-A (Year: 2025).*
(Continued)

*Primary Examiner* — Matthew J Song
(74) *Attorney, Agent, or Firm* — Lerner David LLP

(57) ABSTRACT

The invention relates to a crystal growing unit comprising a crucible for producing and/or enlarging a single crystal. The crystal growing unit has a first thermal insulation with a first thermal conductivity and a second thermal insulation with a second thermal conductivity. The crucible has a crucible base, a crucible side wall and a crucible cover. The crucible side wall is indirectly or directly surrounded by the first thermal insulation. The second thermal insulation is arranged indirectly or directly above the crucible cover. The second thermal conductivity is greater than the first thermal conductivity.

28 Claims, 12 Drawing Sheets

(56) References Cited

U.S. PATENT DOCUMENTS

Figure 1A:
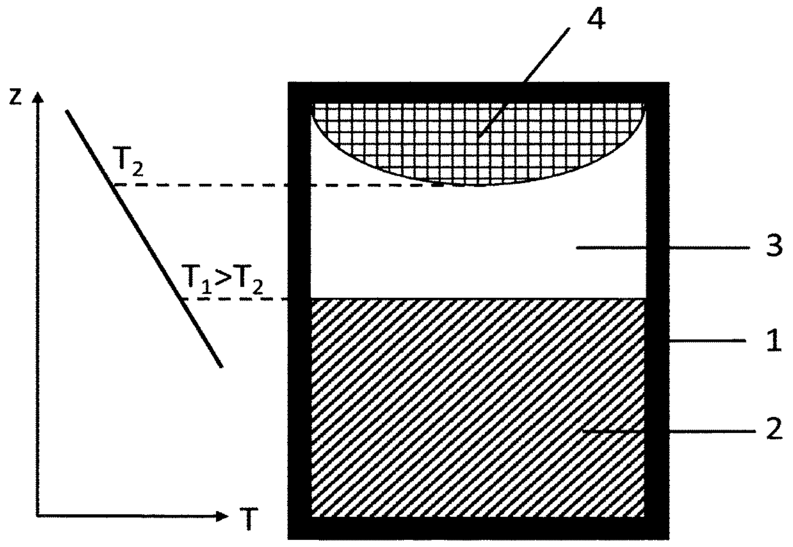

| | | | | |
|---|---|---|---|---|
| 2011/0226628 | A1* | 9/2011 | Kraus | C01B 33/035 205/157 |
| 2011/0259316 | A1* | 10/2011 | Pelletier | C30B 11/003 126/343.5 R |
| 2011/0305622 | A1 | 12/2011 | Dietrich et al. | |
| 2013/0171403 | A1 | 7/2013 | Straubinger et al. | |
| 2014/0182516 | A1* | 7/2014 | Son | C30B 23/00 118/726 |
| 2014/0220296 | A1 | 8/2014 | Loboda et al. | |
| 2016/0122903 | A1* | 5/2016 | Hori | C30B 23/063 118/712 |
| 2017/0321345 | A1 | 11/2017 | Xu et al. | |
| 2018/0282902 | A1* | 10/2018 | Nakabayashi | C30B 29/36 |
| 2019/0323145 | A1 | 10/2019 | Xu et al. | |
| 2020/0032414 | A1* | 1/2020 | Muto | C30B 29/36 |
| 2020/0190691 | A1 | 6/2020 | Fujikawa | |

FOREIGN PATENT DOCUMENTS

| | | | |
|---|---|---|---|
| DE | 102009015113 | A1 | 10/2010 |
| DE | 102014217956 | A1 | 3/2016 |
| JP | 2011178622 | A | 9/2011 |
| JP | 2018039715 | A | 3/2018 |
| JP | 2020093965 | A | 6/2020 |
| KR | 20150115902 | A | 10/2015 |

OTHER PUBLICATIONS

International Search Report for PCT/EP2021/067312 mailed Oct. 13, 2021. 3 pgs.

Peter J Wellmann. "Review of SiC crystal growth technology" Semiconductor Science Technology, IOP Publishing Ltd, GB, vol. 33, No. 10, Sep. 5, 2018 (Sep. 5, 2018), p. 103001. 22 pgs.

"Graphite Insulation Boards", Noboran Trade & Service Co. Ltd. [retreived on Jan. 20, 2022 <http://noboran.com/page.php?page=124/Graphite_Insulation_Boards>]. 2 pgs.

Tairov, Yu. M. and Valeri F. Tsvetkov. "Investigation of growth processes of ingots of silicon carbide single crystals." Journal of Crystal Growth 43 (Mar. 1978): 209-212.

Japanese Office Action for Appliation No. 2022-581356 dated Jun. 11, 2024, 4 pages.

Office Action for Chinese Application No. 202180047557.9 dated Sep. 3, 2025. 9 pgs.

* cited by examiner

CRYSTAL GROWING UNIT FOR PRODUCING A SINGLE CRYSTAL

CROSS-REFERENCE TO RELATED APPLICATIONS

The present application is a national phase entry under 35 U.S.C. § 371 of International Application No. PCT/EP2021/067312, filed Jun. 24, 2021 (published as WO 2022/002745 on Jan. 6, 2022), which claims priority from German Application No. DE 10 2020 117 661.9, filed Jul. 3, 2020, all of which are incorporated herein by reference.

The invention relates to a crystal growing unit comprising a crucible for producing a single crystal. The crystal growing unit makes it possible in particular to enlarge a single crystal provided in the growth crucible. The invention furthermore relates to a method for producing and/or enlarging a single crystal in a growth crucible of a crystal growing unit.

In practice, numerous single crystals are produced for use in electronic components or for utilization as semiprecious stones by evaporating a source material at high temperatures and by deposition or crystallization in a slightly colder spot according to the so-called PVT (physical vapor transport) method.

The principles for producing single crystals from silicon carbide by means of the PVT method are known from the scientific publication Yu. M. Tairov, V. F. Tsvetkov, *Investigation of Growth Processes of Ingots of Silicon Carbide Single Crystals*, Journal of Crystal Growth 43 (1978) 209-212. The scientific publication P. J. Wellmann, *Review of SiC crystal growth technology*, Semiconductor Science and Technology 33, 103001, gives an overview of the current research in relation to the production of single crystals using the example of silicon carbide.

In order that the crystallization process proceeds uniformly, an axial temperature gradient is set between the source material and the growing single crystal. This ensures that, on the one hand, (i) the hotter source material evaporates and crystallizes in the colder spot on the growing single crystal and that, on the other hand, (ii) the heat of crystallization (=latent heat) which is released at the crystallization growth front is dissipated through the growing single crystal. At the same time, it is important to keep the radial temperature gradient as small as possible. Otherwise, thermally induced stresses occur in the growing single crystal. These stresses result in dislocations being incorporated in the growing single crystal. In the case of radial temperature gradients that are too large, the crystal defect density in the growing single crystal therefore increases. In the case of methods according to the state of the art, the radial temperature gradients can be set only with limited accuracy. This results in difficulties in particular during the production of large single crystals.

The object of the present invention is to overcome the disadvantages from the state of the art. In particular, a crystal growing unit comprising a growth crucible and a method are to be specified, with which a particularly uniform temperature distribution perpendicular to the axial direction can be set. The quality is thereby to be improved in particular during the production of large single crystals.

In accordance with the invention, the crystal growing unit comprises a crucible for producing and/or enlarging a single crystal. The single crystal is preferably produced and/or enlarged using the PVT method. The crucible is preferably formed cylindrical or substantially cylindrical. Alternatively, the crucible can be formed cuboidal or substantially cuboidal. The crystal growing unit has a first thermal insulation with a first thermal conductivity and a second thermal insulation with a second thermal conductivity. The provision of the first and second thermal insulation advantageously makes it possible to thermally insulate the crucible, preferably to settably thermally insulate the crucible. The first thermal insulation is preferably a high thermal insulation. The first thermal insulation preferably consists of a first insulation material, in particular a first high-temperature insulation material. This is a solid material, e.g. graphite felt and/or graphite foam. The second thermal insulation is preferably a medium-high thermal insulation. The second thermal insulation preferably consists of a second insulation material, in particular a second high-temperature insulation material. This is a solid material, e.g. graphite foam and/or porous graphite. The crucible has a crucible base, a crucible side wall and a crucible cover. The crucible base can be referred to as lower crucible wall, the crucible side wall as lateral crucible wall and the crucible cover as upper crucible wall. The crucible side wall is indirectly or directly surrounded by the first thermal insulation. The crucible side wall is preferably indirectly or directly completely surrounded by the first thermal insulation. The first thermal insulation is preferably formed as a hollow cylinder. The second thermal insulation is arranged indirectly or directly above the crucible cover. The second thermal insulation is preferably formed as a solid cylinder or substantially as a solid cylinder. The second thermal insulation is preferably radially surrounded by the first thermal insulation, in particular completely radially surrounded by the first thermal insulation. The second thermal insulation is particularly preferably directly surrounded by the first thermal insulation. The second thermal insulation is preferably in direct contact with the first thermal insulation. In accordance with the invention, the second thermal conductivity is greater than the first thermal conductivity.

Within the meaning of the present application, an object is directly surrounded by an insulation if no further object lies between the object and the insulation, in particular if the object and the insulation touch partially or over the whole surface. Within the meaning of the present application, an object is indirectly surrounded by an insulation if a further object and/or a sufficiently large cavity lies between the object and the insulation. By cavity is meant here a space filled with air and/or inert gas and/or an evacuated space. Within the meaning of the present application, for example, the crucible side wall is indirectly surrounded by the first thermal insulation if a resistance-heating unit is arranged between the crucible side wall and the first thermal insulation.

The invention takes advantage of the fact that the size and direction of a heat flow from a hot to a colder region can be controlled through the use of insulation materials with different thermal conductivity.

Through the invention a uniform heat flow in an axial direction is advantageously realized. By providing the first and second thermal insulation and by correspondingly setting the heat output, an extremely uniform temperature distribution perpendicular to the axial direction can be set. The heat of crystallization arising when materials are crystallized from the gas phase, from the melt or from the solution can be uniformly dissipated from the crucible.

Thermally induced stresses in the crystallized material can thereby be minimized.

The shape of the growth phase boundary of the growing single crystal is advantageously slightly convex, relative to the gas space, i.e. viewed from the source material. This is preferably realized by providing isotherms that are similarly convexly curved within the crucible. The shape of the isotherms is controlled by the heat flow. The basic heat flows are preferably determined by (i) the geometric arrangement of the heating zones (on the basis of the resistance-heating units explained further below and/or inductively coupled-in heating zones), (ii) the structure of the crucible, (iii) the surrounding thermal insulation and/or (iv) the colder inside walls of the crystal growing unit.

The invention is aimed at spatially directing the heat flow from the hot growth cell towards the cooler surrounding area. Via the thus-optimized temperature distribution, the radial temperature gradients in the crystallizing material are kept very small and thus the thermally induced stresses in a radial direction are reduced. Through a defined setting of the outward heat flow, the axial temperature gradient can also be reduced to a minimum.

The invention is based on a defined spatial arrangement of the thermal insulation surrounding the crucible which consists of several zones with different insulation properties, i.e. of different thermal conductivity. The radial temperature gradient can thereby be reduced to a value less than or equal to 0.1 K/cm. The axial temperature gradient then still present can be set in a defined manner by adaptation of the second thermal insulation within broad limits between 0.1 K/cm and more than 20 K/cm—independently of the radial temperature gradients.

It has been shown that the growth rate and the growth kinetics of the single crystal, i.e. for example also the occurrence of crystal defects, are in particular dependent on the temperature at the surface of the single crystal. In areas of the surface of the single crystal with a temperature that is too high, adsorption of the gaseous precursor material onto the single crystal does not take place. In the case of a temperature that is too low, too fast an adsorption of the gaseous precursor material takes place, as a consequence of which growth defects can increasingly occur.

The temperature gradients can be set by providing the surrounding insulation materials with different thermal conductivities. Providing the surrounding insulation materials with different thermal conductivities can influence thermal conduction and convection within the crucible. Thermal conduction is in principle effected through all solids, liquids and gases. It can be described by Fourier's law. Convection is caused by moving gases and liquids. Furthermore, providing the surrounding insulation materials with different thermal conductivities can influence the heat transfer by radiation within the crucible. The heat transfer by radiation is of importance in particular in relation to the cavity described further below and in relation to the nucleus cavity described further below. The heat transfer by radiation is typically significant at T>500° C. and dominates at T>1000° C. during the crystal growing.

With the aid of the invention the temperature at the growth boundary surface of the single crystal can advantageously be set depending on the temperature gradients. This temperature is preferably set in a range of from 1750° C. to 2500° C., particularly preferably in a range of from 1900° C. to 2300° C. The temperature gradients preferably have a value of from 0.1 K/cm to 10 K/cm.

Furthermore, with the aid of the invention an optimum temperature field and a suitable gas phase composition for the material transport or the material flow can be achieved.

With the aid of the invention it is advantageously possible to set optimum heat flows in the interior of the crucible in a targeted manner. Growth defects, such as e.g. dislocations, can thereby be prevented. The method according to the invention is therefore suitable in particular for the production of large single crystals, for example single crystals with a diameter of 150 mm, 200 mm, 250 10 mm, 300 mm or with an even larger diameter, in particular consisting of SiC or AlN. In the crystal growing unit according to the invention or through the method according to the invention, the diameter of the single crystal is therefore preferably from 100 mm to 300 mm, particularly preferably 150 mm, 200 mm, 250 mm or 300 mm. The diameter of the crucible preferably exceeds the diameter of the single crystal by from 1 mm to 150 mm.

The present invention is not limited to the PVT method, but rather can be used in all gas-phase growth processes. The present invention can for example be used in processes in which gases are supplied as precursors. The present invention can thus be used e.g. in chemical vapor deposition (CVD). The invention is likewise of importance for use in the case of crystallization from the melt, for example according to the "Bridgman" and "Vertical Gradient Freeze" methods.

According to an advantageous embodiment of the invention, a source material provided in the crucible can be heated, evaporated and deposited.

A single crystal is furthermore arranged in the interior of the crucible. The source material and the single crystal are preferably arranged at the two axially opposite ends of the interior of the crucible. The single crystal is preferably arranged at an upper end of the interior of the crucible. With the aid of an axial temperature gradient between source material and single crystal, a heat flow and thus also a material flow, i.e. a transporting of the evaporated source material to the single crystal, is provided. Through the present invention a uniform heat flow in an axial direction is advantageously set.

The source material preferably consists of the same material as the single crystal. A gas space is preferably located between the single crystal and the source material. The interior of the crucible preferably has a cylindrical shape or a substantially cylindrical shape. The source material preferably has a substantially cylindrical shape. The source material preferably has a diameter which corresponds to the internal diameter of the cylindrical crucible. The source material thus preferably completely fills the crucible in a radial direction. The single crystal preferably has a substantially cylindrical shape, in particular the shape of a cylinder convexly rounded on one side, wherein the convexly rounded side of the single crystal is facing the source material. The single crystal preferably has a diameter which substantially corresponds to the internal diameter of the crucible. The single crystal can touch the inside of the crucible wall. Alternatively, the single crystal can be produced without direct contact with the crucible wall. Moreover, the single crystal can be surrounded by a polycrystalline ring. The polycrystalline ring can rest against the inside of the crucible wall.

The source material can in particular comprise a carbide and/or a nitride. Silicon carbide, or SiC written as a formula, is preferably used as source material. SiC, particularly preferably a SiC powder and/or a SiC solid body, is preferably provided as source material. The SiC solid body can in particular be polycrystalline.

Alternatively, aluminum nitride, i.e. AlN, can for example be used as source material. An AlN powder and/or an AlN solid body, in particular a polycrystalline AlN solid body, can preferably be provided.

A further possible source material is zinc oxide (ZnO). The source material is preferably provided as a powder and/or as a compact solid body. The compact solid body can in particular be polycrystalline.

Preferably, a single crystal to be enlarged is firstly provided as a crystal nucleus at the end of the interior of the crucible lying opposite the source material. Instead of the term "crystal nucleus", the terms seed crystal and/or nucleus of crystallization could also be used. Starting from the crystal nucleus, the single crystal is enlarged in the course of the method according to the invention by adsorption of gaseous precursor material produced by evaporating the source material. The crystal nucleus preferably has a diameter which corresponds to from 60% to 100%, preferably 75% to 95%, of the internal diameter of the crucible. For a diameter of the crystal nucleus of 150 mm, the internal diameter of the crucible can for example be from 150 mm to 200 mm. The crystal nucleus preferably consists of the same material as the source material. If SiC is used as source material, a SiC single crystal is formed as single crystal. Preferably, to carry out the method according to the invention, a SiC single crystal is firstly provided as crystal nucleus at the end of the interior of the crucible lying opposite the source material. During the performance of the method according to the invention, the SiC single crystal is enlarged. The SiC single crystal preferably grows in an axial direction.

If AlN is used as source material, an AlN single crystal is formed as single crystal. Preferably, to carry out the method according to the invention, an AlN single crystal is firstly provided as crystal nucleus at the end of the interior of the crucible lying opposite the source material. During the performance of the method according to the invention, the AlN single crystal is enlarged. The AlN single crystal preferably grows in an axial direction.

Alternatively, the crystal nucleus can consist of a different material than the source material. If AlN is used as source material, alternatively a SiC single crystal can for example be provided as crystal nucleus.

According to a further advantageous embodiment of the invention, the first thermal insulation is additionally arranged indirectly or directly below the crucible base, with the result that the first thermal insulation is preferably formed as a hollow cylinder closed at the bottom, in particular as a hollow cylinder only closed at the bottom. To put it another way, the first thermal insulation could be referred to as a cylinder with a blind hole open at the top. The first thermal insulation is thus preferably in the shape of a beaker.

According to a further advantageous embodiment of the invention, the first thermal conductivity lies in a range of from 0.05 to 5 W/(m*K), preferably in a range of from 0.1 to 2 W/(m*K), particularly preferably is 0.5 W/(m*K). According to the invention, the second thermal conductivity lies in a range of from 2 to 50 W/(m*K), preferably in a range of from 5 to 20 W/(m*K), particularly preferably is 10 W/(m*K).

According to a further advantageous embodiment of the invention, the crystal growing unit comprises a cavity arranged between crucible cover and the second thermal insulation. The surface of the first thermal insulation can indirectly or directly adjoin the cavity. The surface of the second thermal insulation can indirectly or directly adjoin the cavity.

The cavity is preferably filled with an inert gas, in particular with argon. Alternatively, the cavity contains a vacuum. The pressure within the cavity is preferably between 1 and 1000 mbar.

The cavity is preferably delimited at the top by the lower surface of the second thermal insulation, at the bottom by the upper surface of the crucible cover and at the side by the inner surface of the first thermal insulation. The crucible cover is preferably formed of dense graphite. The first thermal insulation is preferably formed of graphite felt or graphite foam. The second thermal insulation is preferably formed of graphite foam or porous graphite.

Alternatively, the surfaces adjoining the cavity can also be formed by the crucible cover and by a hollow cylinder applied to the crucible cover, preferably a hollow graphite cylinder. This has a stabilizing mechanical function. As a result, the cavity is therefore provided with a greater mechanical stability. The surface of the first thermal insulation indirectly adjoining the cavity and the surface of the second thermal insulation indirectly adjoining the cavity are therefore clad with the hollow cylinder, preferably with the hollow graphite cylinder, in this embodiment. The cavity can preferably be delimited at the side by a hollow graphite cylinder and/or at the top by a graphite disk. The wall thickness of the hollow graphite cylinder or the thickness of the graphite disk preferably lies between 1 mm and 30 mm, particularly preferably in a range between 5 mm and 15 mm.

By providing the cavity, the heat transfer or the heat flow from the crucible via the crucible cover into the second thermal insulation can advantageously be further optimized. Ideal growth conditions with respect to the absolute temperature and the axial and radial temperature gradients can thereby be realized in the crystal growth space.

According to a further advantageous embodiment of the invention, the surface of the first thermal insulation adjoining the cavity has a predetermined first emissivity (ε), and/or the surface of the second thermal insulation adjoining the cavity has a predetermined second emissivity (ε) and/or the surface of the crucible cover adjoining the cavity has a predetermined third emissivity (ε). In the above-mentioned alternative embodiment, the emissivities (ε) of the hollow cylinder, preferably the hollow graphite cylinder and/or the graphite disk, can be correspondingly adapted. In this alternative embodiment, the surface, adjoining the cavity, of the hollow graphite cylinder cladding the first thermal insulation preferably has the predetermined first emissivity (ε), and/or the surface, adjoining the cavity, of the graphite disk cladding the second thermal insulation has the predetermined second emissivity (ε). In this alternative embodiment, the surface of the crucible cover adjoining the cavity also preferably has the predetermined third emissivity (ε).

The first, second and/or third emissivities (ε) can match. Alternatively, the first, second and/or third emissivities (ε) can differ.

The first, second and/or third emissivity (ε) is preferably set in a range of between 0.6 and 0.9. Due to the thermal radiation exchange between the opposing surfaces, in particular the upper surface of the crucible cover and the lower surface of the second thermal insulation, the surface temperatures of these opposing surfaces are homogenized. This has the result that the outward heat flow from the crucible upwards is aligned even more strongly in an axial direction. The temperature gradient therefore has at most a small radial component. The radial temperature gradient can preferably be reduced to a value less than or equal to 0.1 K/cm. As a result, slightly convex isotherms are advantageously produced at the crystal growth front. Thus, favorable growth conditions for the growing single crystal are advantageously achieved.

In the embodiment with the additional provision of a hollow graphite cylinder and/or a graphite disk described above, the surface temperature distribution of the individual surfaces is homogenized because of the high thermal conduction of the graphite walls in addition to the thermal radiation exchange described above.

Alternatively, the first, second and/or third emissivity (ε) is preferably set in a range of between 0.05 and 0.5, particularly preferably in a range between 0.2 and 0.4, in particular to approximately 0.3.

The surface of the first thermal insulation, the surface of the second thermal insulation, and/or the surface of the crucible cover can be provided with a coating. Through the coating, a low emissivity (ε) can in particular be provided at the corresponding surfaces. Through the coating with TaC, an emissivity ε of approximately 0.3 can for example be provided. The coating in particular of the surface of the second thermal insulation and of the surface of the crucible cover advantageously has a particularly strong effect on the axial temperature gradient in the cavity. The thermal gradients in the crystal growth space advantageously remain largely unaffected thereby. The application of coatings with low emissivity ε advantageously results in an increased axial temperature gradient in the cavity. An increased axial temperature gradient in the cavity is physically accompanied by a reduced heat flow from the crucible. In total, this advantageously results in the fact that the same thermal conditions can be achieved in the crucible interior as it is possible to do if the coating of the surfaces adjoining the cavity is dispensed with, but with a heat output which is 10% to 20% lower. In this way, the coating can be utilized to save electrical energy.

The surface of the second thermal insulation, or of the graphite disk cladding the second thermal insulation, and the surface of the crucible cover are preferably provided with a coating. A coating of the first thermal insulation delimiting the cavity at the side appears to have only a small effect on the radial temperature gradient. This is independent of the provision of a low or high emissivity (ε) and apparently has no appreciable influence on the temperature gradients in the crucible.

At least the second and the third emissivity (ε) preferably match. If a coating of low emissivity (ε) (e.g. with TaC, ε=approx. 0.3) is provided both on the upper surface of the crucible cover and on the lower surface of the second thermal insulation, it is particularly preferred also to coat the inner surface of the first thermal insulation in the same way. Abrupt transitions in the corner areas during the transition from low to high emissivity (ε) and thus associated singular heat transfer peaks are thereby advantageously prevented. Corresponding considerations also apply if a high emissivity (ε) is provided both on the upper surface of the crucible cover and on the lower surface of the second thermal insulation to prevent a transition from high to low emissivity (ε) in the corner areas.

In the case of a hollow graphite cylinder and/or a graphite disk, for example an emissivity ε=0.9 can be provided by roughening, for example an emissivity ε=0.6 can be provided by polishing, or for example an emissivity ε=0.3 can be provided by coating, in particular by coating with TaC. In each case, the above-mentioned advantages also result.

Preferred combinations of second and third emissivity (ε) and the effect resulting therefrom on the axial temperature gradient are shown in the following table:

-continued

| | | | | |
|---|---|---|---|---|
| third emissivity | ε = 0.6 to 0.9 | ε = 0.6 to 0.9 | ε = 0.1 to 0.5 | ε = 0.1 to 0.5 |
| second emissivity | ε = 0.6 to 0.9 | ε = 0.1 to 0.5 | ε = 0.6 to 0.9 | ε = 0.1 to 0.5 |
| axial temperature gradient | small | medium | medium | large |

According to a further advantageous embodiment of the invention, the surface of the crucible cover adjoining the cavity and/or the surface of the first thermal insulation adjoining the cavity and/or the surface of the second thermal insulation adjoining the cavity has a predetermined relief. One surface provided with the predetermined relief or several surfaces provided with the predetermined relief can also, as explained above, have a predetermined emissivity (ε), for example through a coating. For example, the upper surface of the crucible cover additionally provided with a relief can be provided with a coating with low emissivity (ε), e.g. with TaC with an emissivity ε of approximately 0.3.

Beyond the setting of the axial temperature gradient through variation of the emissivity ε of the surfaces, the embossing of a relief advantageously makes it possible to influence the direction of the thermal radiation and thus the radial temperature gradient within the cavity. Thus, the temperature field in the crucible, thus in the area of the growing single crystal, is also advantageously influenced to a small degree. This is important for the fine-tuning of the temperature field in the crucible. A small radial temperature gradient with associated slightly convex isotherms can thereby advantageously be set in a defined manner at the crystal growth front. The temperature field starting from a radial temperature gradient close to 0 K/cm can thereby advantageously be prevented from inadvertently changing into slightly concave isotherms at the crystal growth front through unintended variations in the material properties or geometries, which would result in the massive incorporation of crystal defects. Advantageously, by providing slightly convex isotherms at the crystal growth front, the crystal growth can thus be stabilized at a low crystal defect density.

According to a further advantageous embodiment of the invention, the single crystal is arranged with the aid of a nucleus suspension device. The name nucleus suspension device is explained by the fact that, at the beginning of the method, the single crystal is arranged as crystal nucleus with the aid of the nucleus suspension device. As is known, the single crystal is enlarged in the course of the method starting from the crystal nucleus by adsorption of gaseous source material. In the context of the present application, by the term single crystal is therefore also meant the crystal nucleus. In the further advantageous embodiment of the invention, the crystal growing unit comprises a nucleus cavity arranged between the single crystal and the crucible cover within the crucible. The nucleus cavity is preferably delimited by the inner surface of the nucleus suspension device, the lower surface of the crucible cover and the upper surface of the single crystal.

The nucleus cavity is preferably filled with an inert gas, in particular with argon. Alternatively, the nucleus cavity contains a vacuum. The pressure within the nucleus cavity is preferably between 1 and 1000 mbar.

The nucleus suspension device can be formed of graphite. By providing the nucleus suspension device, the growing single crystal can be mechanically separated from the crucible. Thermally induced mechanical stresses in the single crystal, as could otherwise occur in the case of a single crystal attached to the crucible in a conventional manner due to the different thermal expansion coefficients of the single crystal and the crucible formed of graphite or the conventional nucleus carrier generally formed of dense graphite, can thereby be prevented.

According to a further advantageous embodiment of the invention, the surface of the nucleus suspension device adjoining the nucleus cavity has a predetermined fourth emissivity (ε), and/or the surface of the crucible cover adjoining the nucleus cavity has a predetermined fifth emissivity (ε) and/or the surface of the single crystal adjoining the nucleus cavity has a predetermined sixth emissivity (ε). The surface of the nucleus suspension device adjoining the nucleus cavity and/or the surface of the crucible cover adjoining the nucleus cavity and/or the surface of the single crystal adjoining the nucleus cavity can be provided with a coating for this. The coating can be C, i.e. carbon or graphite, TaC and/or a pyrolytic coating with carbon (PyC). Through a coating with C, i.e. with carbon or graphite, the emissivity (ε) can preferably be set to 0.9. Through a coating with TaC, the emissivity (ε) can preferably be set to 0.3. Through a pyrolytic coating with carbon (PyC), the emissivity (ε) can preferably be set to 0.6.

The fourth, fifth and/or sixth emissivities (ε) can match. Alternatively, the fourth, fifth and/or sixth emissivities (ε) can differ.

The level of emissivity (ε), in particular of the fifth and/or sixth emissivity (ε), set in particular by providing one of the above-mentioned coatings advantageously influences the axial temperature gradient in the nucleus cavity. The application of coatings with low emissivity (ε) advantageously results in an increased axial temperature gradient in the nucleus cavity. An increased axial temperature gradient in the nucleus cavity advantageously results in a higher supersaturation of the growth species at the growth front of the growing single crystal. Such a supersaturation is advantageous in the production of SiC with a cubic polytype, i.e. in the production of 3C—SiC.

In contrast, the application of coatings with high emissivity (ε) advantageously results in a reduced axial temperature gradient in the nucleus cavity. A reduced axial temperature gradient in the nucleus cavity advantageously results in a low supersaturation of the growth species at the growth front of the growing single crystal. That is advantageous in the production of SiC with a hexagonal polytype, for example in the production of 6H—SiC and in particular in the production of 4H—SiC.

In the case of the production of a single crystal from SiC, the preferred value range of the predetermined fourth, fifth and sixth emissivity (ε) thus depends, among other things, on the type of the desired polytype.

An overview of various combinations of the fifth and sixth emissivity (ε) and the resulting temperature gradient is shown in the following table. In each case, the type of the preferred coating for achieving the emissivity (ε) mentioned is indicated in brackets.

| | | | | | | | |
|---|---|---|---|---|---|---|---|
| sixth emissivity | ε = 0.9 (C) | ε = 0.3 (TaC) | ε = 0.6 (PyC) | ε = 0.9 (C) | ε = 0.3 (TaC) | ε = 0.6 (PyC) | ε = 0.6 (PyC) |
| fifth emissivity | ε = 0.9 (C) | ε = 0.3 (TaC) | ε = 0.6 (PyC) | ε = 0.3 (TaC) | ε = 0.9 (C) | ε = 0.3 (TaC) | ε = 0.9 (C) |
| axial temperature gradient | small | large | medium | large | large | large | medium |

According to a further advantageous embodiment of the invention, the surface of the crucible cover adjoining the nucleus cavity and/or the surface of the nucleus suspension device adjoining the nucleus cavity and/or the surface of the single crystal adjoining the nucleus cavity has a predetermined further relief. By providing the further relief, the radial temperature gradient in the nucleus cavity and/or in the gas space of the crucible is preferably influenced. In particular, a small radial temperature gradient with associated slightly convex isotherms can for example be set in a defined manner at the crystal growth front of the growing single crystal. The temperature field starting from a radial temperature gradient close to 0 K/cm can thereby advantageously be prevented from inadvertently changing into slightly concave isotherms at the crystal growth front through unintended variations in the material properties or geometries, which would result in the massive incorporation of crystal defects. Advantageously, by providing slightly convex isotherms at the crystal growth front the crystal growth can thus be stabilized at a low crystal defect density.

According to a further advantageous embodiment of the invention, the nucleus cavity is filled with a solid material. The solid material preferably consists of SiC powder, a polycrystalline or monocrystalline SiC crystal, and/or porous or solid graphite. The solid material is preferably a temperature-stable material which is chemically inert with respect to SiC. The solid material is preferably provided in such a way that it does not hinder the transporting of heat away from the single crystal to the crucible cover. By providing the solid material in the nucleus cavity, a further possibility is advantageously provided to guarantee a defined transporting away of the heat of crystallization.

According to a further advantageous embodiment of the invention, the crystal growing unit comprises a heating device for heating the crucible, in particular for heating the source material and/or the single crystal. The heating device preferably comprises one or more induction-heating units and/or one or more resistance-heating units.

An induction-heating unit is preferably formed with a coil. The coil can be provided outside the first thermal insulation. When an induction-heating unit is provided, the crucible, in particular the crucible side wall of the crucible, is preferably electrically conductive. In the case of the induction-heating unit, the heat input is preferably effected via the crucible side wall. In other words, the crucible side wall itself is preferably the heating zone.

Furthermore, an electrically conductive susceptor can be arranged, as part of the heating device, between the crucible side wall and the first thermal insulation. The susceptor can comprise a material-free area. The susceptor serves for the primary absorption of the induction power generated by means of the induction-heating unit. The susceptor is formed, for example, of graphite.

The material-free area contains a vacuum or a gas, for example. By providing the susceptor, the absorption of the induction power can advantageously be improved. The induction-heating unit can preferably be operated in a frequency range between 3 and 50 kHz, particularly preferably between 5 and 20 kHz.

The resistance-heating unit is preferably embodied with graphite heating elements. The graphite heating elements preferably form a heating winding on the outside around the crucible side wall of the crucible. A meander-shaped design of the heating winding is particularly preferred. When a resistance-heating unit is provided, the first thermal insulation is preferably provided on the outside around the resistance-heating unit.

The induction-heating unit and the resistance-heating unit can be combined with each other. Thus, both an induction-heating unit and a resistance-heating unit can preferably be provided. In that case, the resistance-heating unit preferably surrounds the crucible side wall, the first thermal insulation surrounds the resistance-heating unit and the induction-heating unit surrounds the first thermal insulation. In that case, the resistance-heating unit preferably directly surrounds the crucible wall, and/or the first thermal insulation directly surrounds the resistance-heating unit, and/or the induction-heating unit directly surrounds the first thermal insulation.

According to a further advantageous embodiment of the invention, the heating device is arranged between the crucible base and the first thermal insulation and/or between the crucible side wall and the first thermal insulation. It is thereby possible to form different heating zones. The heating device arranged between the crucible base and the first thermal insulation is preferably designed as a resistance-heating unit.

By heating underneath the crucible base, i.e. between the crucible base and the first thermal insulation, and providing the second thermal insulation above the crucible cover, the heat flow is guided in an axial direction through the crucible and through the growing single crystal.

With the aid of heating at the crucible side wall, the average temperature of the crucible can be brought to a defined value.

At the same time, a small radial temperature gradient is thereby also impressed in the area of the growing single crystal, wherein the size of the small radial temperature gradient can be varied through the ratio of the heat flows from the lower and/or lateral heating. This small radial temperature gradient results in the development of slightly convex (viewed from the source material) isotherms and correspondingly thereto of a slightly convex crystal growth phase boundary.

Furthermore, by heating the crucible side wall, a component of the heat flow directed radially outwards from the crucible, i.e. a transporting of the heat away from the crucible through the crucible side wall, which would result because of the insulation property of the first thermal insulation laterally surrounding the crucible not being infinitely high, is overcompensated. As a result, the development of concave (viewed from the source material) isotherms and correspondingly thereto of a concave crystal growth phase boundary having negative effects for the crystal growth is advantageously prevented.

Through a combination of heating from below and from the side and the defined selection of the second thermal insulation, the average temperature and the axial temperature gradient can advantageously be set in a defined manner in the case of a minimal radial temperature gradient.

Preferred heating combinations are heating only from below, heating only from the side or combined heating from below and from the side. The heating of the crucible is particularly preferably effected from the side with an optional additional heating from below.

According to a further advantageous embodiment of the invention, the crystal growing unit comprises a first and/or a second pyrometer access. The first and/or second pyrometer access is preferably provided for determining the temperature of the crucible by means of an optical pyrometer. The first pyrometer access penetrates the second thermal insulation up to the crucible cover, preferably along the axis of rotation of the crucible. A temperature measurement of the crucible through the first pyrometer access is preferably effected directly on the crucible cover. In addition or alternatively, the second pyrometer access penetrates the first thermal insulation and/or the heating device up to the crucible base, preferably along the axis of rotation of the crucible. A temperature measurement of the crucible through the second pyrometer access is preferably effected directly on the crucible base.

The preferred heating of the crucible from the side with an optional additional heating from below that is described above can for example be combined with a second pyrometer access. For this, a narrow opening channel is provided as optical access in the first thermal insulation and in the heating device arranged between the crucible base and the first thermal insulation. Thus, a temperature measurement can advantageously be effected directly on the crucible base.

According to a further advantageous embodiment of the invention, the first thermal insulation is arranged indirectly or directly above a radially outer annular surface of the crucible cover. It is thereby possible to set the strength of the upward heat flow from the crucible.

As already described above, the second thermal insulation is arranged indirectly or directly above the crucible cover. There are various possibilities: the second thermal insulation can be arranged over the whole surface above the crucible cover. The second thermal insulation can be arranged above a radially inner circular surface of the crucible cover. A central pyrometer access can furthermore pass through these mentioned surfaces, with the result that the second thermal insulation can be arranged above an annular surface of the crucible cover in the presence of a central pyrometer access. The annular surface can, depending on the case described above, be a radially outer or a radially inner annular surface. Because of the small diameter of the pyrometer access, the mentioned annular surfaces can also be referred to approximately as circular surfaces.

In all mentioned cases, an indirect or direct arrangement of the second thermal insulation above the crucible cover is possible. With respect to an indirect arrangement, the cavity already described above is in particular relevant. The cavity can for example be arranged between the crucible cover on the one hand and the radially outer first thermal insulation as well as the radially inner second thermal insulation on the other hand.

In the case of a cylindrical crucible and a cylindrical second thermal insulation, the diameter of the second thermal insulation is preferably between 10 and 120% of the diameter of the crucible. The diameter of the second thermal insulation is particularly preferably between 80% of the diameter of the useful area of the single crystal, i.e. the diameter of the single crystal planned as product, and 100% of the diameter of the crucible. In the case of a cuboidal crucible and a cuboidal second thermal insulation, corresponding size ratios are preferred.

According to a further advantageous embodiment of the invention, the crucible base, the crucible side wall and/or the crucible cover of the crucible is formed of graphite and/or TaC and/or coated graphite, in particular graphite pyrolytically coated with carbon and/or graphite coated with Ta and/or TaC. The abbreviated form PyC can also be used for a pyrolytic coating with carbon.

The crucible is preferably suited to being heated to temperatures in the range of from 1000° C. to 2500° C., in particular temperatures in the range of from 1500° C. to 2500° C.

According to a further advantageous embodiment of the invention, the source material in the crucible can, depending on temperature gradients, be evaporated, and/or transported and/or deposited. More precisely, the source material is preferably transported and/or deposited in the gaseous state, i.e. as a gaseous precursor material. The temperature gradients can be set and/or controlled in a targeted manner in the crucible. The temperature gradients can be differentiated into axial and radial temperature gradients. More precisely, the temperature gradients have an axial and/or a radial component. The setting or control of the temperature gradients preferably involves a setting and/or control of the heat flows within the crystal growing unit and in particular within the crucible. In the present application, reference is principally made to the temperature gradients. It goes without saying that they are temperature gradients in the three-dimensional interior of the crystal growing unit and in particular of the crucible. In fact, with the present invention the three-dimensional temperature field in the interior of the crystal growing unit and in particular of the crucible is to be controlled and/or set. The invention can be understood in a corresponding manner such that the isotherms, in particular the progression of the isotherms, in the three-dimensional interior of the crucible are controlled and/or set.

The temperature gradients running perpendicular to the isotherms are of major importance in crystal growing. Along the temperature gradients running perpendicular to the isotherms, the gas pressure differences are most pronounced locally. Therefore, the material transport or the material flow is preferably effected substantially along these temperature gradients perpendicular to the isotherms. Furthermore, the heat flows preferably run along the temperature gradients running perpendicular to the isotherms.

Through the present invention a uniform heat flow in an axial direction is advantageously set.

According to a further advantageous embodiment of the invention, the crystal growing unit is formed for the targeted setting and/or control of temperature gradients in the crucible. The temperature gradients, in particular the radial temperature gradients or the radial portion of the temperature gradients, can be set through the design of the first and/or second thermal insulation in such a way that the isotherms have a convex progression. The isotherms preferably have the convex progression within the crucible, particularly preferably in a surrounding area of the growing single crystal, in particular at the growth front of the growing single crystal. The convex progression of the isotherms results when seen from the source material. The isotherms thus bulge downwards. The convex progression of the isotherms is preferably achieved in that the radial component of the temperature gradients is set to at most approximately 0.1 K/cm and the axial component of the temperature gradients is set to between 0.1 and more than 20 K/cm, preferably to from 0.2 to 5 K/cm, particularly preferably to from 0.3 to 2 K/cm.

According to a further advantageous embodiment of the invention, the temperature gradients in the crucible can be set by the heating device. As explained above, the heating device can be formed by different heating units, in particular induction-heating units and/or resistance-heating units. The temperature gradients can preferably be set by the geometric arrangement of heating units and/or by the formation of different heating zones. Furthermore, the temperature gradients can be set by varying the heat output in one or more heating units and/or in different heating zones.

According to a further advantageous embodiment of the invention, the first thermal insulation consists of a first insulation material, in particular a first high-temperature insulation material. The first thermal insulation preferably consists of a solid material, particularly preferably graphite felt and/or graphite foam. In addition or alternatively, the second thermal insulation consists of a second insulation material, in particular a second high-temperature insulation material.

The second thermal insulation preferably consists of a solid material, particularly preferably graphite foam and/or porous graphite.

By this is preferably meant that the first thermal insulation is completely filled with the first insulation material and/or the second thermal insulation is completely filled with the second insulation material.

Alternatively, the first thermal insulation can contain the first insulation material, in particular the first high-temperature insulation material, preferably the solid material, particularly preferably graphite felt and/or graphite foam. The second thermal insulation can contain the second insulation material, in particular the second high-temperature insulation material, preferably the solid material, particularly preferably graphite foam and/or porous graphite.

The first insulation material and the second insulation material preferably differ. In particular, the first insulation material preferably differs in terms of its thermal conductivity from the second insulation material. The first insulation material preferably has the first thermal conductivity. The second insulation material preferably has the second thermal conductivity. According to the invention, the second thermal conductivity is greater than the first thermal conductivity. The difference between the first and the second insulation material can consist of the choice of different materials or the provision of different properties of similar materials, for example graphite foams of different density.

According to a further advantageous embodiment of the invention, the second thermal insulation is formed of a series of several sheets spaced apart from each other in each case. The sheets are preferably circular disk-shaped.

Each individual sheet preferably reflects the highest possible proportion of the thermal radiation incident on it and preferably transmits the lowest possible proportion of the thermal radiation incident on it. The sheets therefore preferably act as radiation shields.

According to the invention, it also applies in this advantageous embodiment that the second thermal conductivity is greater than the first thermal conductivity. In the series of several sheets, by the second thermal conductivity is meant an effective thermal conductivity. The effective thermal conductivity can be determined from the absolute coefficient of thermal conductivity of the whole series of several sheets by removing a surface area and a thickness of the whole series of several sheets from the calculation. By the coefficient of thermal conductivity is meant the reciprocal of thermal resistivity.

According to a further advantageous embodiment of the invention, the second thermal insulation is formed of from two to ten, preferably of from three to five, sheets.

According to a further advantageous embodiment of the invention, the sheets are formed of a material with high temperature stability. The material with high temperature stability is preferably graphite, coated graphite, metal carbide and/or metal with a high melting temperature.

The coated graphite can be e.g. graphite coated with pyrolytic carbon, Ta, TaC and/or SiC. The metal carbide can be e.g. tantalum carbide. The metal with a high melting temperature can be e.g. Ta, W and/or Zr.

According to a further advantageous embodiment of the invention, the sheets in each case have a thickness of between 0.1 and 10 mm, preferably 0.5 and 3 mm.

According to a further advantageous embodiment of the invention, successive sheets in each case have a spacing in the range of from 1 to 50 mm, preferably 5 to 20 mm.

The spacing is preferably set by one or more spacers. The spacer or spacers have, for example, a thickness of from 0.5 mm to 5 mm, preferably 0.5 to 3 mm. The spacer or spacers are preferably formed of a material with high temperature stability, preferably the same material as the sheets. Alternatively, the spacer or spacers can be formed of another, ideally thermally insulating material, for example graphite foams or felts.

Several spacers can for example be designed as thin rods. The spacers can alternatively be designed as rings. The rings can in particular consist of a thermally insulating material, for example graphite foams or felts. The spacers are preferably arranged in a radially outer area of the sheets.

Alternatively or in addition, an annular receiving body with receiving grooves provided therein can be provided. The sheets preferably grip with their radially outer area in the receiving grooves. The receiving body is preferably made from thermally insulating material, for example graphite foam or felt.

According to a further advantageous embodiment of the invention, the sheets have, at their surfaces, an emissivity set in a defined manner, preferably an emissivity of at most 0.4 or an emissivity of at least 0.6. An emissivity of at most 0.3 or an emissivity of at least 0.7 is particularly preferred.

In addition to the number of sheets, the emissivity of the surfaces of the sheets can influence the strength of the thermal insulation. If a low emissivity on both sides is provided, a smaller number of sheets can preferably be provided than if a higher emissivity on both sides is provided.

For example, in a temperature range of from 1500° C. to 2500° C., three to five sheets with an emissivity of 0.3 on both sides provide the same high-temperature insulation as five to eight sheets with an emissivity of 0.7 on both sides. The sheets with the emissivity of 0.3 on both sides are made e.g. from graphite with a TaC coating or from TaC. The sheets with an emissivity of 0.7 on both sides have e.g. a shiny graphite surface. The high-temperature insulation achieved by the mentioned number of sheets preferably corresponds to the high-temperature insulation of a graphite foam or graphite felt in the same temperature range.

According to a further advantageous embodiment of the invention, the emissivities of successive sheets differ. In addition or alternatively, the emissivities differ at an underside and at an upper side of one or more sheets.

A more accurate setting of the effective thermal conductivity and thus of the high-temperature insulation achieved is thereby possible.

According to a further advantageous embodiment of the invention, the sheets in each case have several elongate incisions. The incisions in each case preferably run in a radial direction starting from an outer circumference of the sheets. The incisions preferably do not penetrate into a radially inner area of the sheets. In particular, the incisions preferably do not meet each other. Adjacent incisions preferably have an angular spacing of between 5° and 90°, preferably between 10° and 45°, particularly preferably between 15° and 30°, with respect to each other. Adjacent incisions in each case preferably have the same angular spacing with respect to each other.

By providing such incisions, an inductive coupling of induction power into the sheets can advantageously be prevented or at least greatly reduced.

Adjacent sheets are preferably turned with respect to each other in such a way that the respective incisions are offset with respect to each other. The adjacent sheets are preferably turned by half the angular spacing of adjacent incisions. A possibly interfering vertical radiation of heat through the incisions can advantageously be suppressed thereby.

In accordance with the invention, a method for producing and/or enlarging a single crystal by heating, evaporating and depositing a source material in a crucible of a crystal growing unit, in particular in the crucible of a crystal growing unit according to the invention, is furthermore claimed. The single crystal is preferably produced and/or enlarged according to the PVT method.

The method comprises the following steps:

- Heating the source material and the single crystal, with the result that a temperature gradient between the source material and the single crystal forms. A temperature gradient running in an axial direction or running substantially in an axial direction preferably forms. The source material is preferably heated to temperatures of from 1750° C. to 2500° C., particularly preferably from 1900° C. to 2300° C.
- Evaporating hot source material to form gaseous precursor material in the gas phase. The source material is preferably sublimed here. The gaseous precursor material is then preferably transported in the gas phase. In the example of SiC as source material, the gaseous precursor material substantially preferably comprises gaseous $SiC_2$, gaseous Si and gaseous $Si_2C$.
- Depositing the gaseous precursor material from the gas phase on the single crystal. The single crystal is thus preferably enlarged by adsorption of the gaseous precursor material. The crystal nucleus originally provided is thereby preferably continuously overgrown. The single crystal grows in particular in an axial direction. If SiC is used as source material, SiC is adsorbed on the single crystal. If AlN is used as source material, AlN is adsorbed on the single crystal.

The crucible is preferably cylindrical or substantially cylindrical. Alternatively, the crucible can be cuboidal or substantially cuboidal.

The source material is, depending on temperature gradients, evaporated, and/or transported and/or deposited. More precisely, the source material is preferably transported and/or deposited in the gaseous state, i.e. as a gaseous precursor material. The temperature gradients are set and/or controlled in a targeted manner.

The crucible has a crucible base, a crucible side wall and a crucible cover. The crucible base can be referred to as lower crucible wall, the crucible side wall as lateral crucible wall and the crucible cover as upper crucible wall. The crucible side wall is indirectly or directly surrounded by a first thermal insulation with a first thermal conductivity. The first thermal insulation preferably consists of a first insulation material, in particular a first high-temperature insulation material. This is a solid material, e.g. graphite felt and/or graphite foam. A second thermal insulation with a second thermal conductivity is arranged indirectly or directly above the crucible cover. The second thermal insulation preferably consists of a second insulation material, in particular a second high-temperature insulation material. This is a solid material, e.g. graphite foam and/or porous graphite. The second thermal conductivity is greater than the first thermal conductivity.

The temperature gradients, in particular the radial temperature gradients or the radial portion of the temperature gradients, are set through the design of the first and/or second thermal insulation in such a way that the isotherms have a convex progression. The isotherms preferably have the convex progression within the crucible, particularly preferably in a surrounding area of the growing single crystal, in particular at the growth front of the growing single crystal. The convex progression of the isotherms results when seen from the source material. The isotherms thus bulge downwards. The convex progression of the isotherms is preferably achieved in that the radial component of the temperature gradients is set to at most approximately 0.1 K/cm and the axial component of the temperature gradients is set to between 0.1 and more than 20 K/cm, preferably to from 0.2 to 5 K/cm, particularly preferably to from 0.3 to 2 K/cm.

The following table shows preferred values of the thermal conductivity of various materials that can be used in the crystal growing unit.

| | Preferred value k @RT [W/(m*K)] | Parameter range k @RT [W/(m*K)] | Preferred range k @RT [W/(m*K)] |
|---|---|---|---|
| dense graphite | 75 | 40 to 100 | |
| first thermal insulation | 0.5 | 0.05 to 5 | 0.1 to 2 |
| second thermal insulation | 10 | 2 to 50 | 5 to 20 |
| SiC single crystal | 25 | | |
| SiC powder with 50% density | 1 | | |

It goes without saying that the material data mentioned in the present application have temperature-dependent properties. The values of the thermal conductivity and/or the emissivity (ε) indicated, by way of example, at room temperature can change under the influence of the process temperature. The trend in the differences is also preserved in the case of high temperatures, however.

Figure 2:
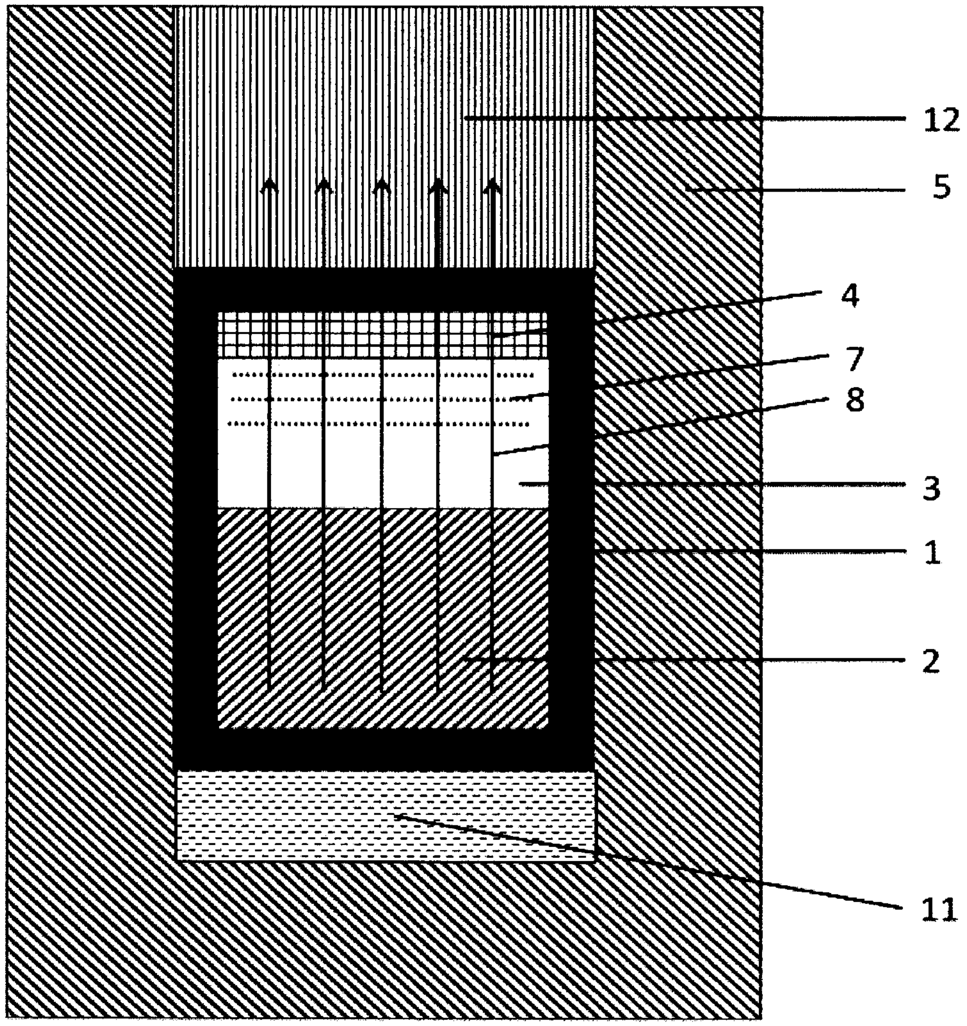
Figure 3A:
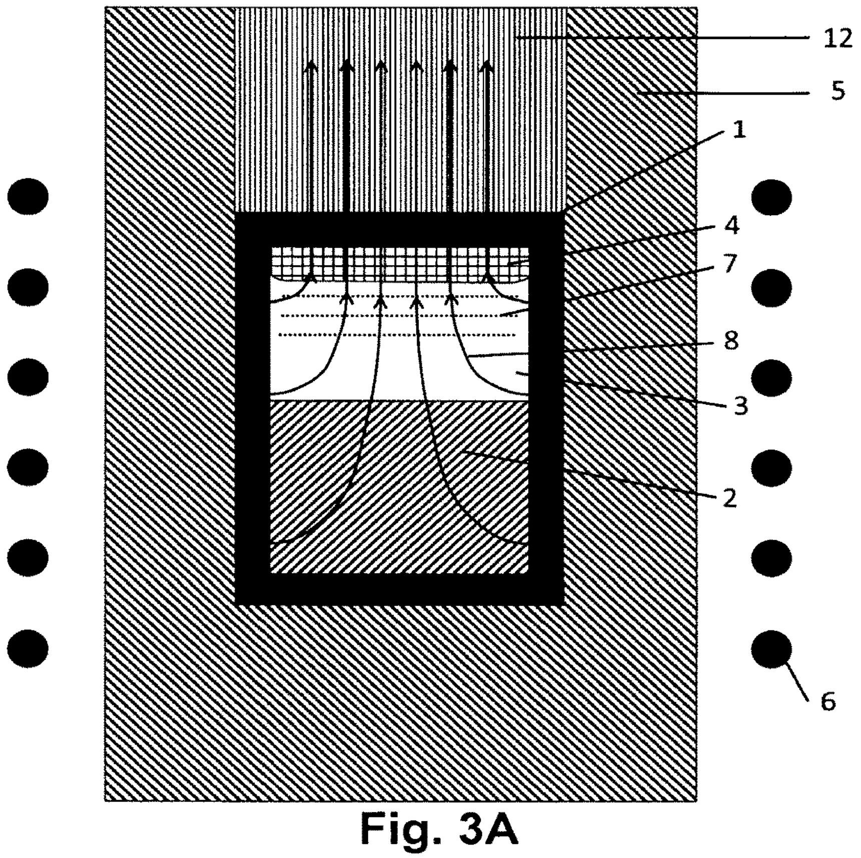
Figure 3B:
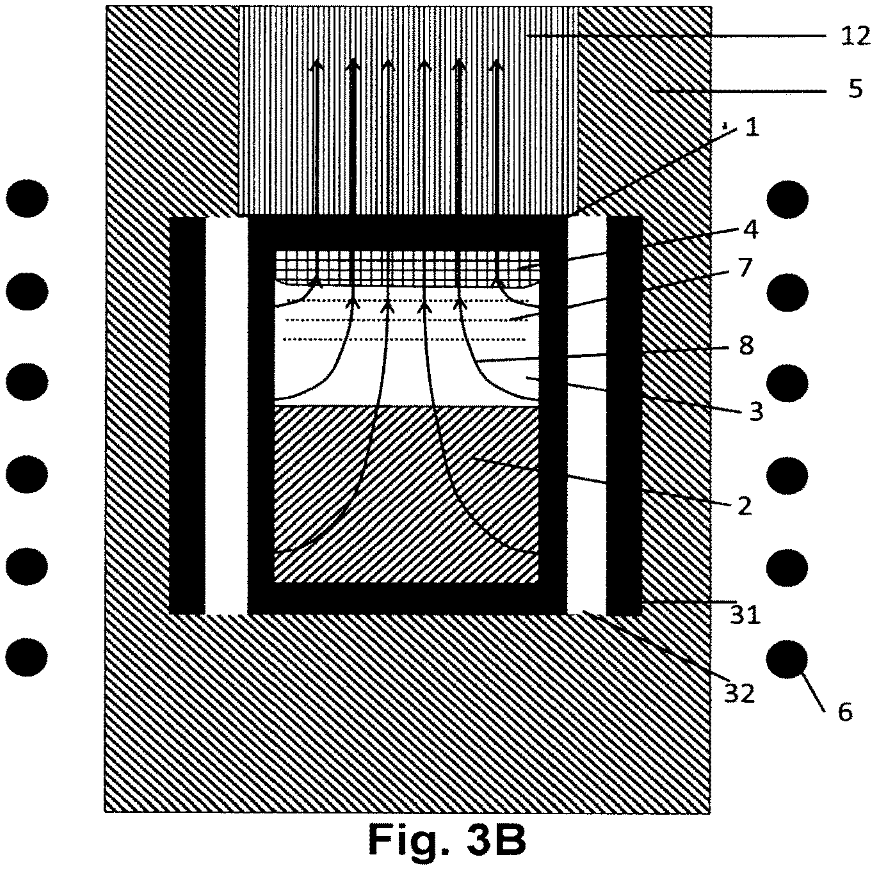
Figure 3C:
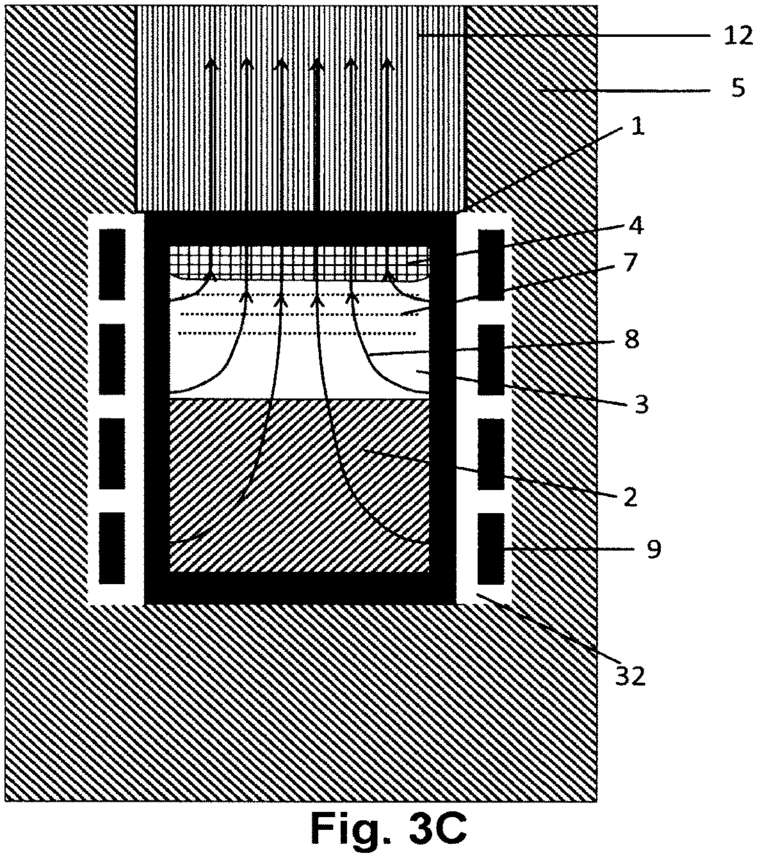
Figure 3D:
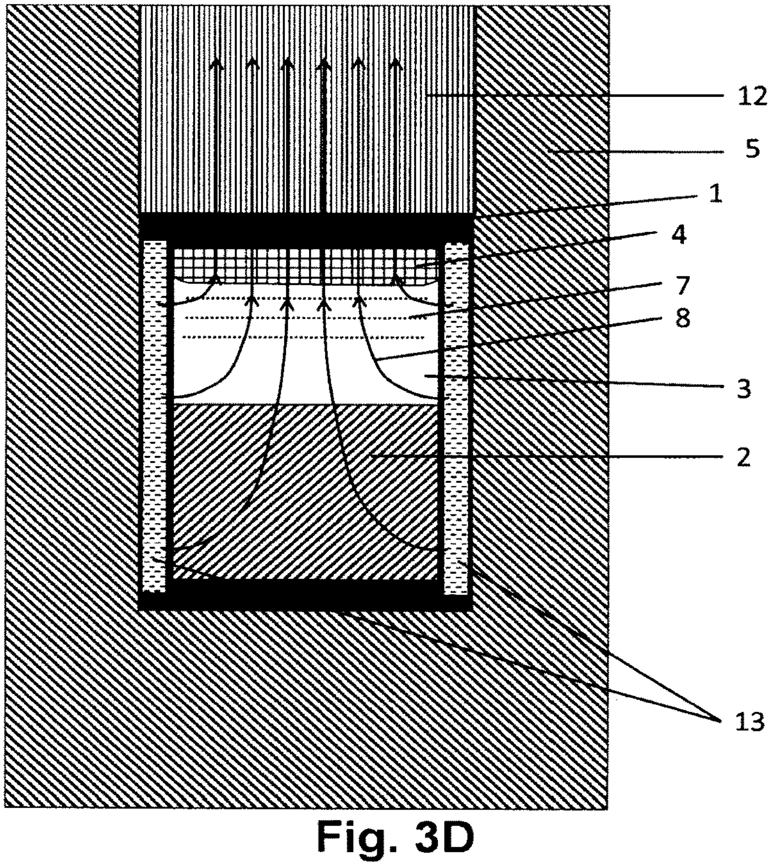
Figure 3E:
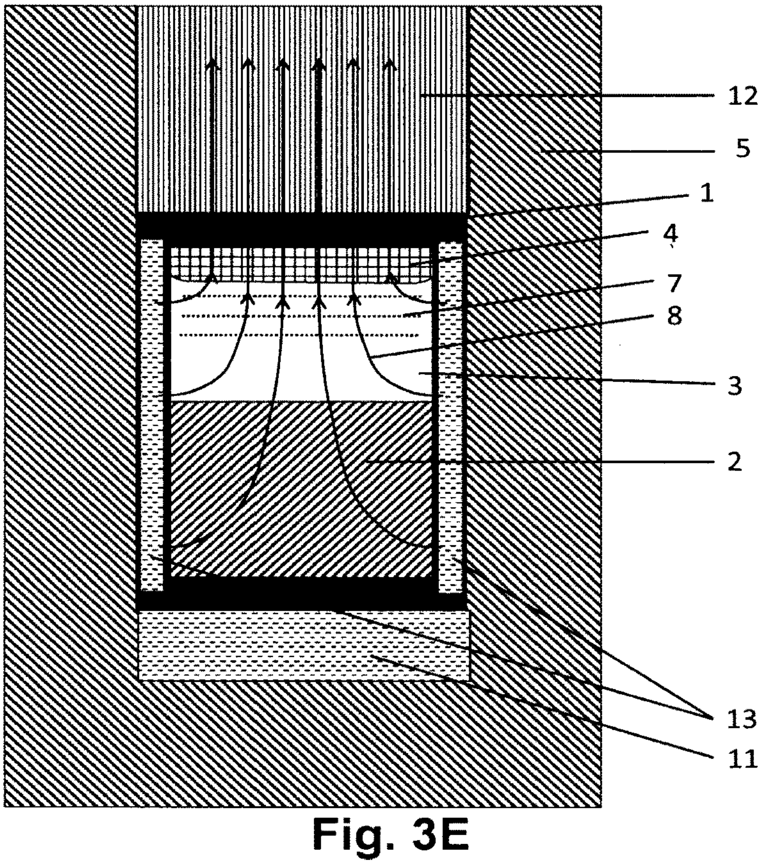
Figure 3F:
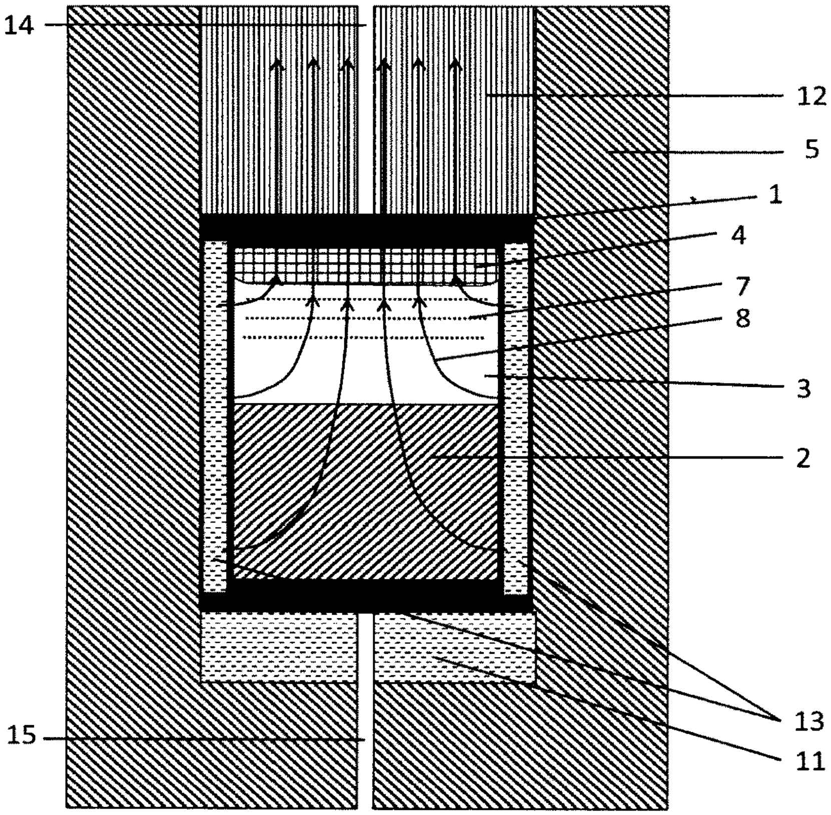
Figure 4:
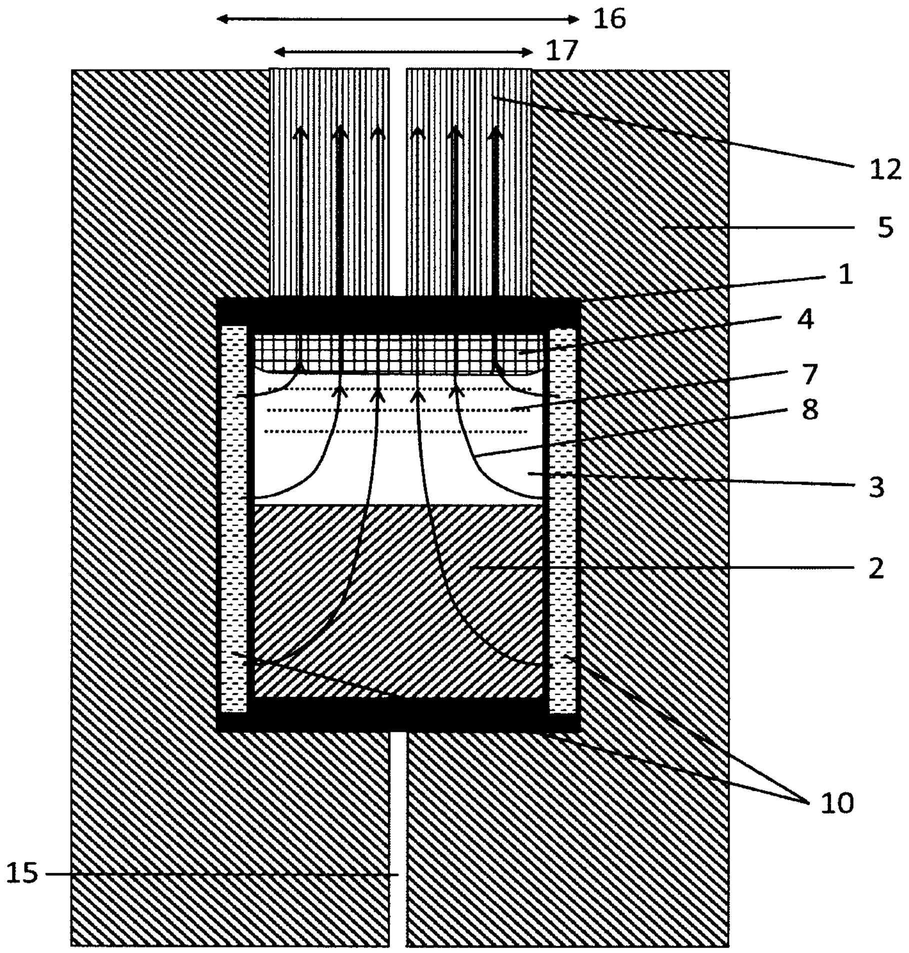
Figure 5A:
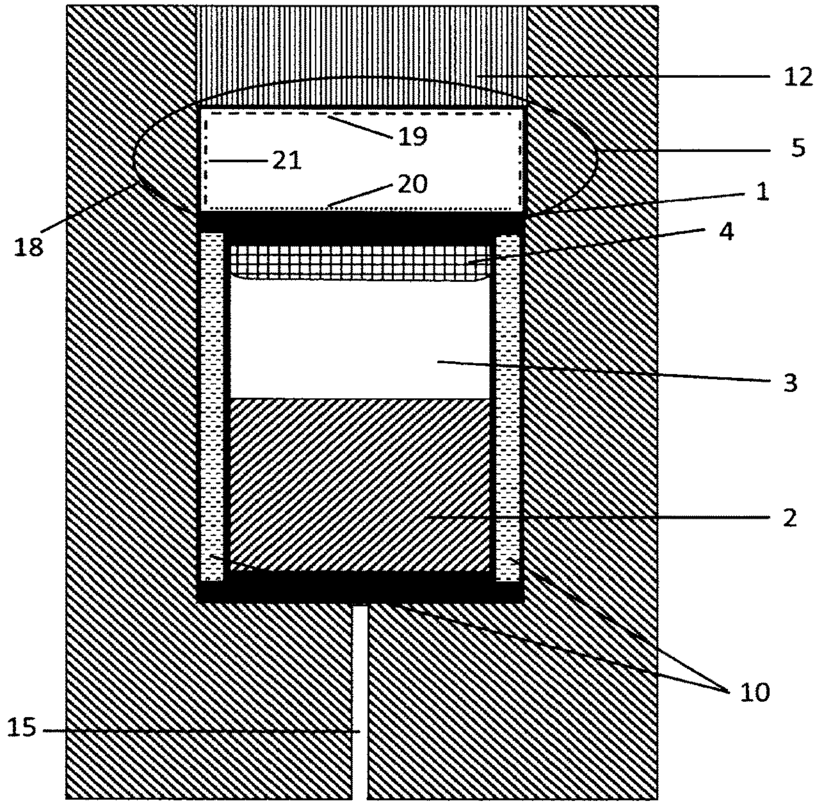
Figure 5B:
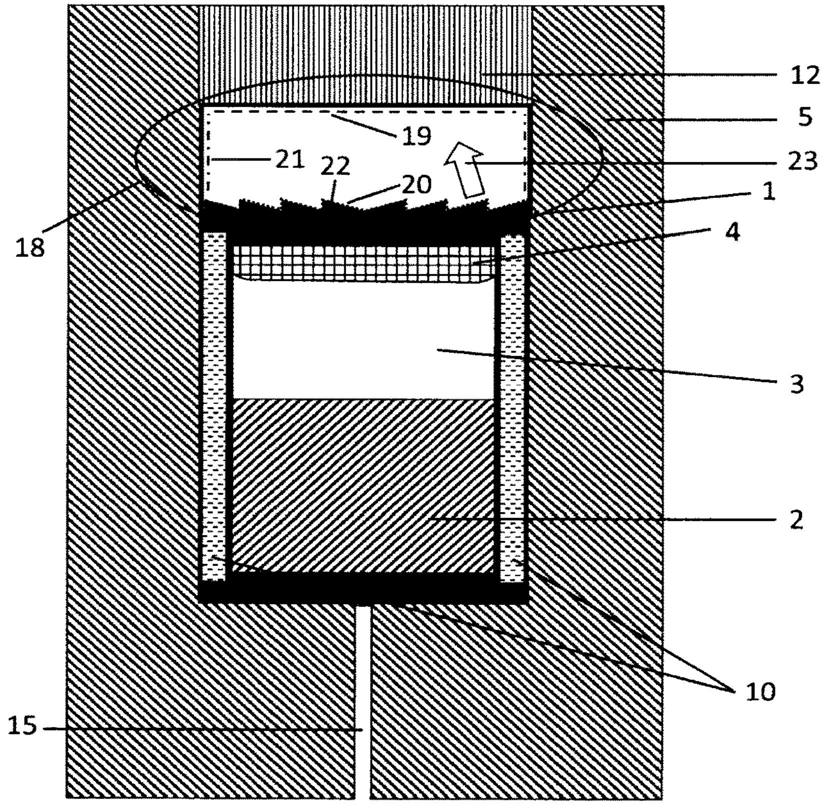
Figure 6:
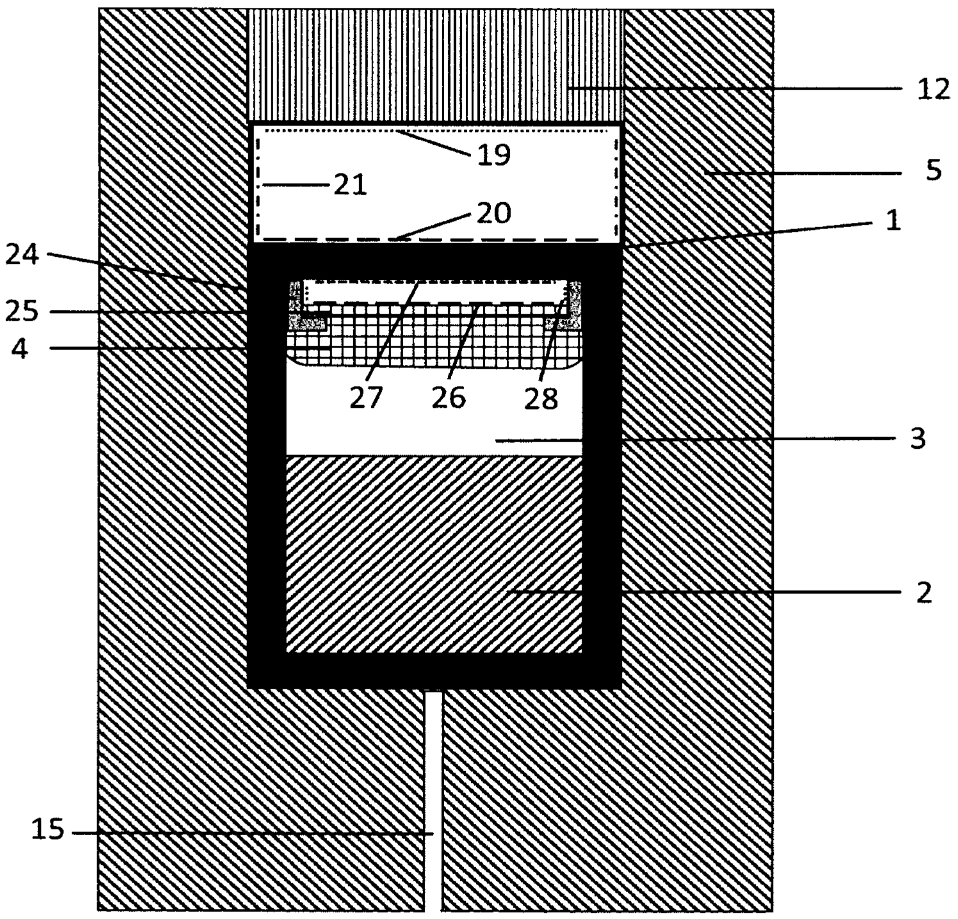
Figure 7A:
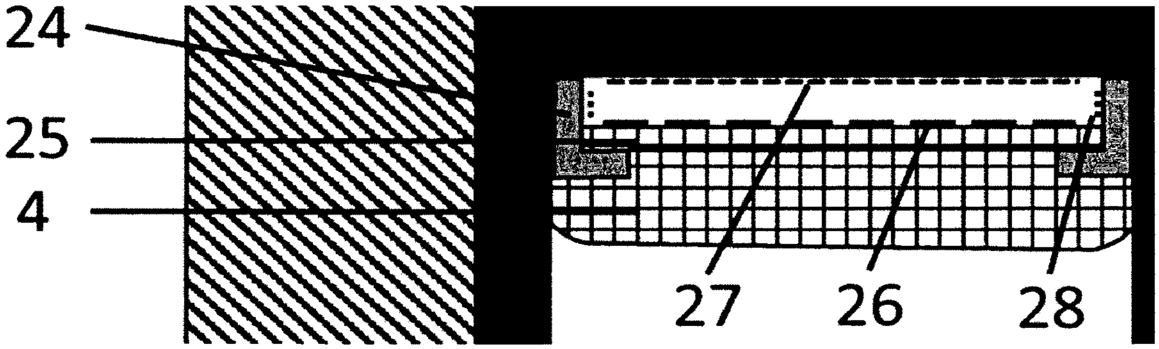
Figure 7B:
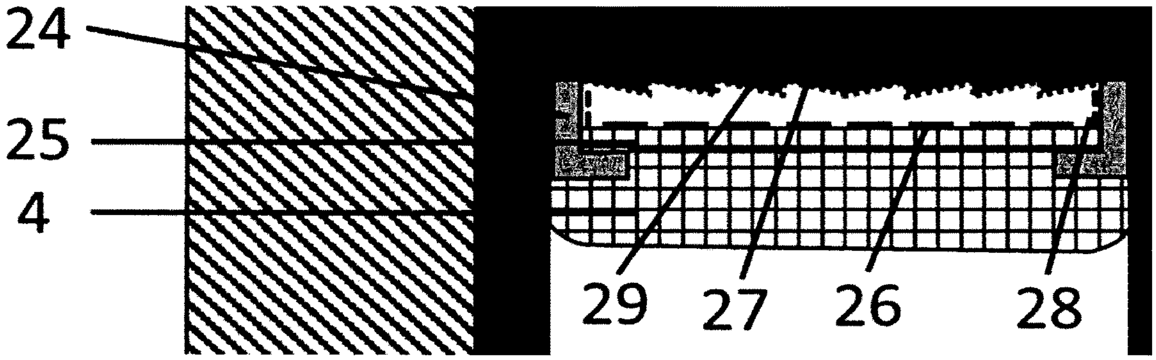
Figure 7C:
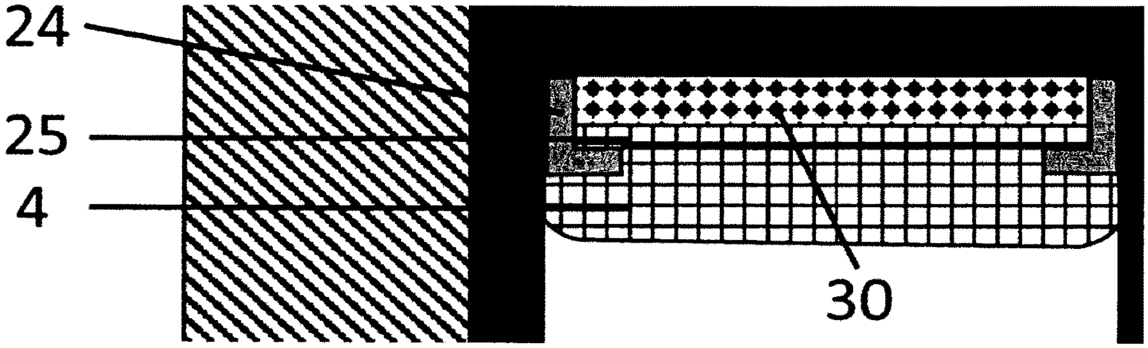
Figure 8:
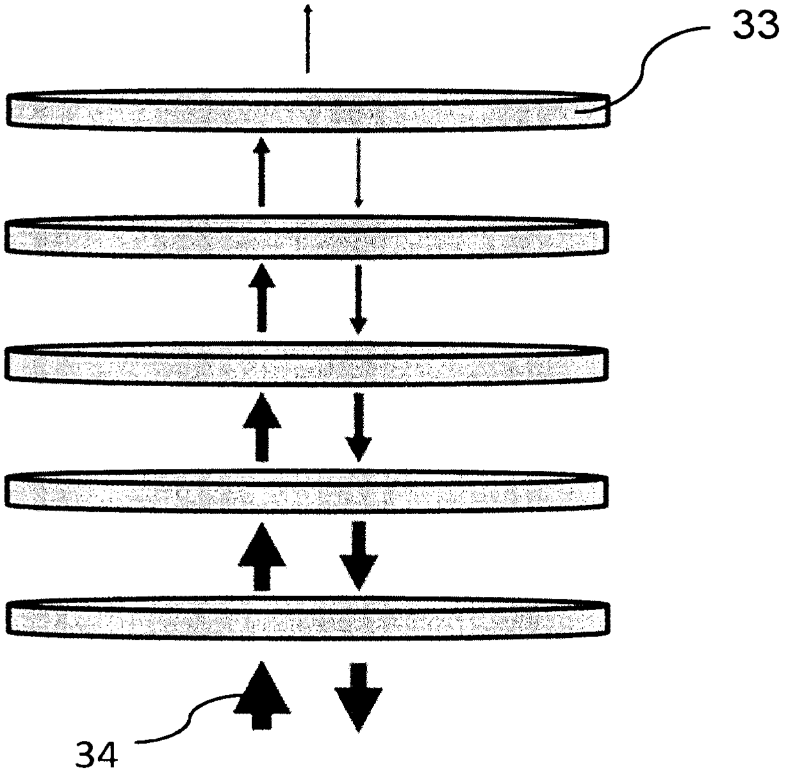
Figure 9:
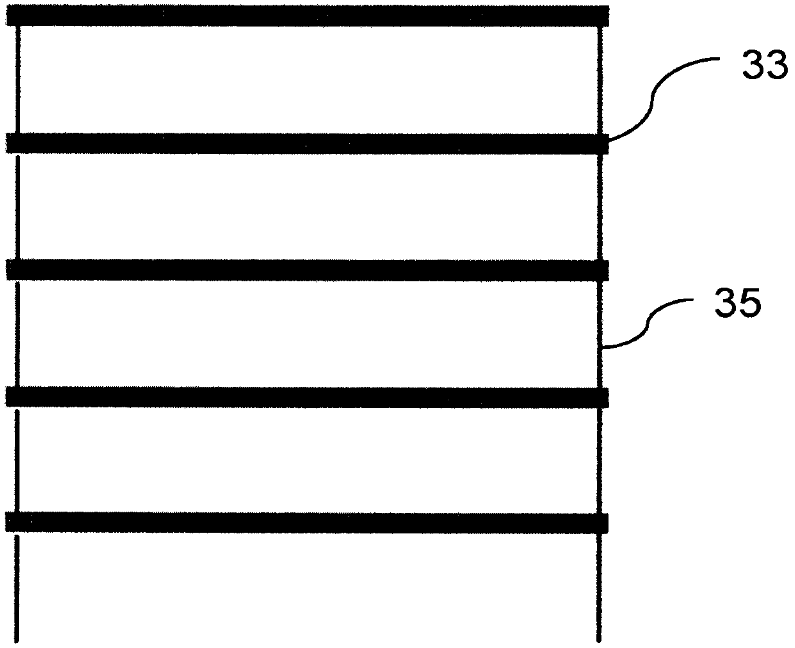
Figure 10A:
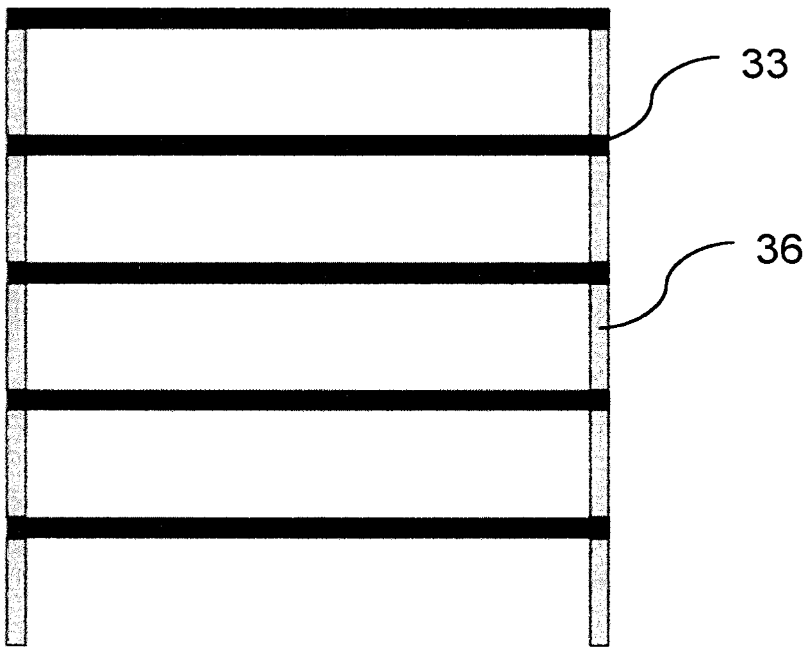
Figure 10B:
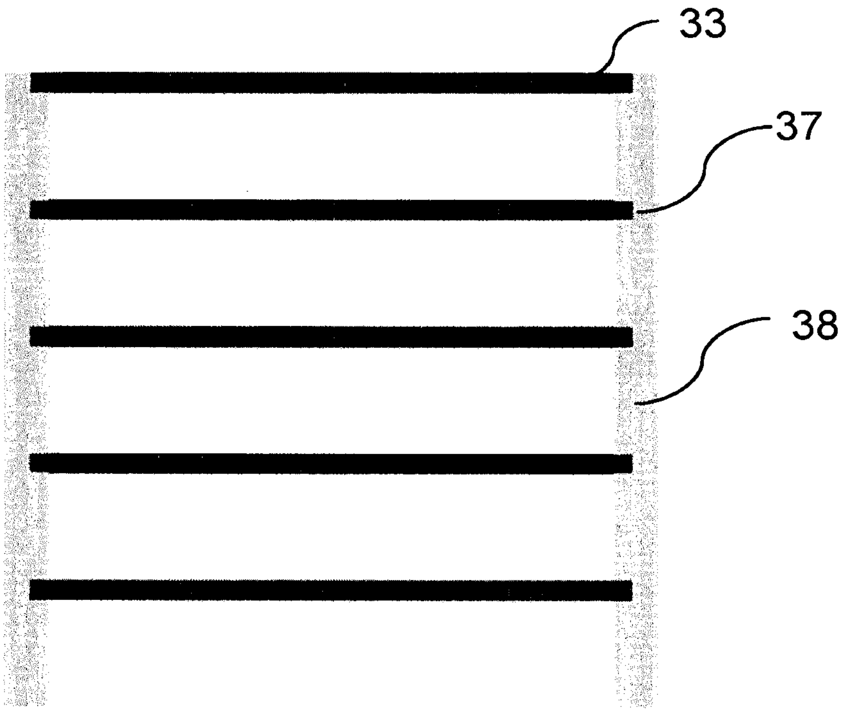
Figure 11:
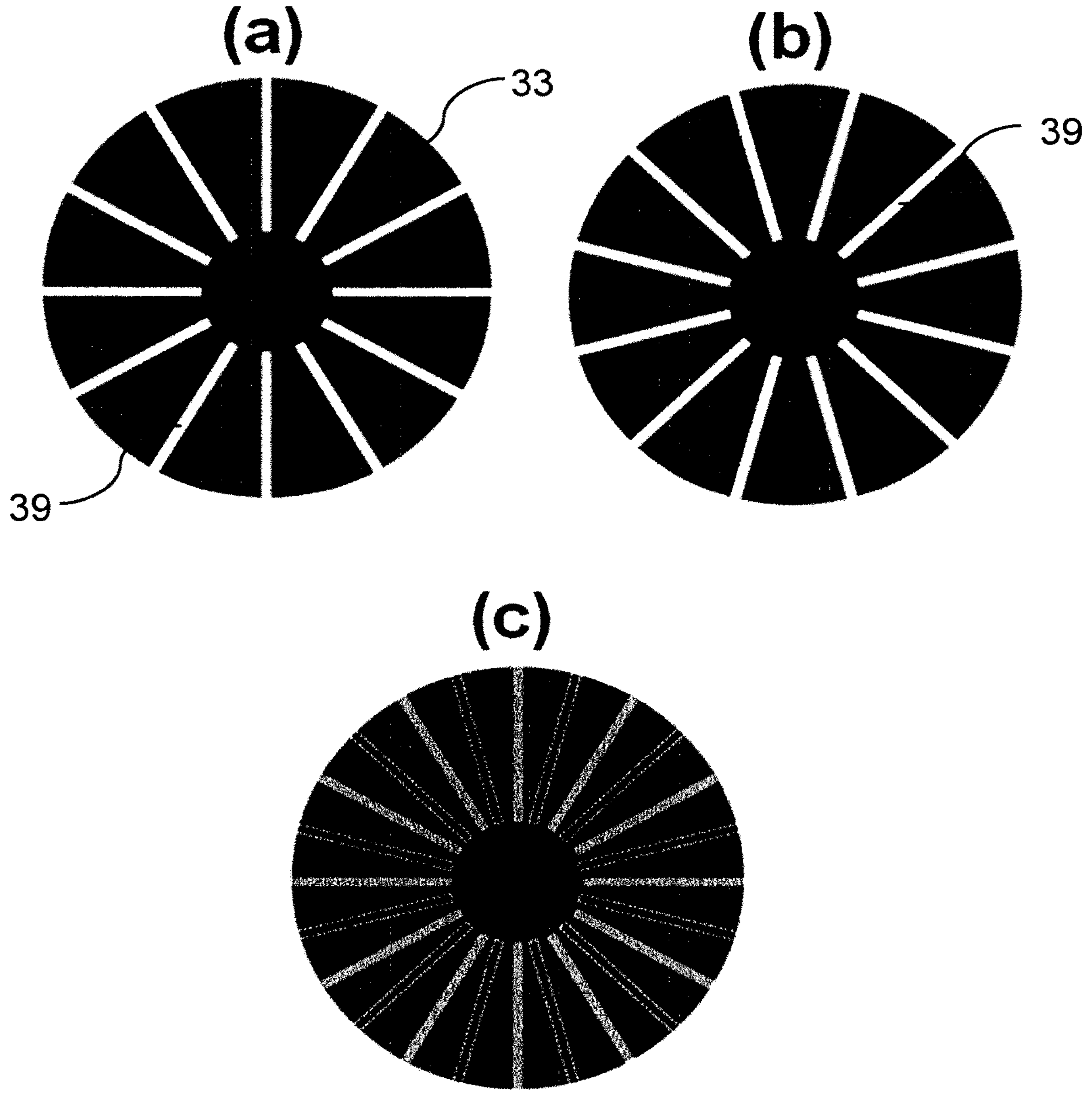

The invention will now be explained in more detail with reference to embodiment examples. There are shown in:

FIG. 1A a schematic representation of a crucible according to the state of the art, a schematic representation of a crystal growing unit with crucible according to the state of the art, FIG. 2 a schematic representation of a first crystal growing unit according to the invention with crucible, FIG. 3A a schematic representation of a second crystal growing unit according to the invention with crucible, FIG. 3B a schematic representation of a third crystal growing unit according to the invention with crucible, FIG. 3C a schematic representation of a fourth crystal growing unit according to the invention with crucible, FIG. 3D a schematic representation of a fifth crystal growing unit according to the invention with crucible, FIG. 3E a schematic representation of a sixth crystal growing unit according to the invention with crucible, FIG. 3F a schematic representation of a seventh crystal growing unit according to the invention with crucible, FIG. 4 a schematic representation of an eighth crystal growing unit according to the invention with crucible, FIG. 5A a schematic representation of a ninth crystal growing unit according to the invention with crucible, FIG. 5B a schematic representation of a tenth crystal growing unit according to the invention with crucible, FIG. 6 a schematic representation of an eleventh crystal growing unit according to the invention with crucible, FIGS. 7A-7C enlarged detail views with various embodiments of the eleventh crystal growing unit according to the invention, FIG. 8 a schematic three-dimensional view of a second thermal insulation as a series of five sheets, FIG. 9 a central two-dimensional section through the series, shown in FIG. 8, of five sheets in a first embodiment, FIG. 10A a central two-dimensional section through the series, shown in FIG. 8, of five sheets in a second embodiment, FIG. 10B a central two-dimensional section through the series, shown in FIG. 8, of five sheets in a third embodiment, and FIG. 11 schematic representations of sheets provided with elongate incisions.

FIG. 1A shows a schematic representation of a crucible according to the state of the art. The cylindrical crucible has a crucible wall 1. The crucible wall 1 is divided into a crucible base, a crucible side wall and a crucible cover. A source material 2, a gas space 3 and a single crystal 4 are accommodated in the interior of the crucible. The source material 2 and the single crystal 4 are arranged at the two axially opposite ends of the interior of the crucible and separated from each other by the gas space 3. The source material 2 has a substantially cylindrical shape. The single crystal 4 has the shape of a cylinder convexly rounded on one side. The source material 2 is for example a silicon carbide powder (written as a formula SiC). A single crystal made of SiC is correspondingly produced as single crystal 4.

To enlarge the single crystal 4, the crucible is heated such that source material 2 passes into the gas phase by sublimation, is transported through the gas space as gaseous precursor material and crystallizes out on the single crystal 4.

The progression of the temperature T in the z-direction, i.e. in the axial direction of the crucible, is schematically set against the crucible. The temperature at the boundary surface of the source material 2 adjoining the gas space 3 is $T_1$. The boundary surface of the source material 2 is preferably flat or substantially flat. The temperature along the boundary surface of the source material 2 is preferably constant. The boundary surface of the source material 2 thus preferably lies on an isotherm with the temperature $T_1$. The temperature $T_1$ is set sufficiently high that a sublimation of source material 2 occurs. The temperature at the boundary surface of the single crystal 4 adjoining the gas space 3 is $T_2$. This boundary surface of the single crystal 4 has a convex shape and can also be referred to as growth boundary surface. The temperature along the convex growth boundary surface is preferably constant. The growth boundary surface is thus preferably formed along an isotherm with the temperature $T_2$. The temperature $T_2$ is lower than the temperature $T_1$. An axial temperature gradient is thus formed between the source material 2 and the single crystal 4. The temperature $T_2$ is set such that a supersaturation of the gaseous precursor material, in particular a supersaturation of the growth species, and consequently a crystallization on the single crystal 4 occurs. The source material 2 is continuously removed by the sublimation. The single crystal 4 is continuously enlarged by the crystallization. The growth boundary surface preferably constantly forms along an isotherm in the process.

Figure 1B:
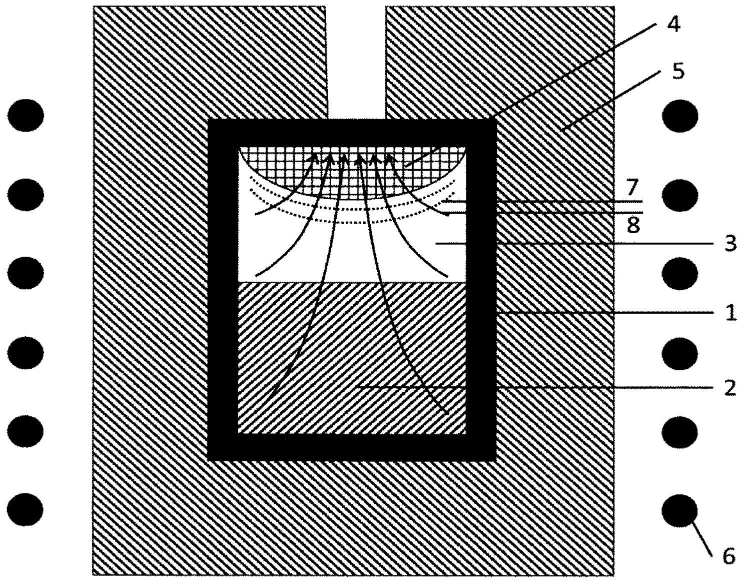

FIG. 1B shows a schematic representation of a crystal growing unit with crucible according to the state of the art. The crystal growing unit has a thermal insulation 5 and an induction-heating unit 6. The thermal insulation 5 surrounds the crucible up to an opening provided in the area of the crucible cover. This opening has the function of a radiating channel via which heat is transported away from the crucible upwards. The heat is preferably transported away upwards via thermal radiation. Thermal radiation is the heat transport mechanism which plays a role at temperatures from 500° C. and dominates the heat transport in (partially) transparent media at temperatures >1000° C. By transporting the heat away through the radiating channel, an axial temperature gradient is provided in the crucible.

The radiating channel brings about a concentration of the heat flow 8. A significant radial component of the heat flow 8 is thereby generated within the crucible. The temperature gradients in the crucible correspondingly have a strong radial component. The isotherms 7 therefore have a pronounced convex shape, viewed from the source material 2. As the growth boundary surface of the growing single crystal 4 forms along an isotherm 7, as described above, a highly convex single crystal is thus formed.

FIGS. 2 to 6 in each case show schematic representations of a first to eleventh crystal growing unit according to the invention comprising a crucible. In all embodiments of the invention, the crystal growing unit and the crucible in each case have all described elements and properties of the crystal growing unit and the crucible from FIG. 1. In addition, the crystal growing unit in each case has both a first thermal insulation 5 with a first thermal conductivity and a second thermal insulation 12 with a second thermal conductivity. The first thermal conductivity is in each case less than the second thermal conductivity. The first thermal insulation 5 consists of a first high-temperature insulation material, for example a graphite felt and/or graphite foam. The first thermal insulation 5 is a high thermal insulation. The second thermal insulation 12 consists of a second high-temperature insulation material, for example a graphite foam and/or porous graphite. The second thermal insulation 12 is a medium-high thermal insulation. The first thermal conductivity is correspondingly low and is for example 0.5 W/(m*K). The second thermal conductivity is medium and is for example 10 W/(m*K).

In the embodiment examples, the crucible side wall is indirectly or directly completely surrounded by the first thermal insulation. The first thermal insulation is in each case formed as a hollow cylinder or substantially as a hollow cylinder. The second thermal insulation is arranged indirectly or directly above the crucible cover. The second thermal insulation is in each case formed as a solid cylinder and is in each case radially completely surrounded by the first thermal insulation.

FIG. 2 shows a schematic representation of a first crystal growing unit according to the invention with crucible. The basic principle of the invention is explained with reference to FIG. 2. The beaker-shaped first thermal insulation 5 encloses a lower heat source 11 arranged over the whole surface below the crucible base of the crucible, the crucible as well as the second thermal insulation 12 arranged over the whole surface above the crucible cover.

By arranging the lower heat source 11 over the whole surface directly below the crucible base of the crucible, by providing a negligibly low thermal conductivity of the first thermal insulation 5 and by arranging the second thermal insulation 12 with medium-high thermal insulation over the whole surface directly above the crucible cover, the heat flow 8 is guided in an axial direction through the crucible and through the growing single crystal 4. In an ideal case, by disregarding the low thermal conductivity of the first thermal insulation 5 an exclusively axial heat flow 8 from bottom to top is realized. The isotherms 7 are horizontal in this ideal case. As the growth boundary surface of the growing single crystal 4 forms along an isotherm 7, as described above, a flat single crystal is thus formed.

If a first thermal insulation 5 with an actual, high (highest possible) thermal insulation is provided, the transporting of the heat away from the crucible gains a small radial component laterally outwards. As a result, slightly concave isotherms 7 are formed at the crystal growth front, viewed from the source material 2. The growth boundary surface, forming along an isotherm 7, of the growing single crystal 4 thus also adopts a slightly concave shape. However, this results in the massive incorporation of crystal defects. By at least partially heating the crucible side wall, the above-mentioned transporting of the heat away from the crucible being effected laterally outwards can be overcompensated. As a result, the slightly concave formation of the growth boundary surface and the negative effect of the incorporation of crystal defects for crystal growth can be prevented. Therefore, in the case of the second to eleventh crystal growing unit according to the invention in FIGS. 3 to 6, a lateral heat source 6, 9, 13 is provided in each case. As a result, in the area of the growing single crystal 4, a defined axial temperature gradient at the same time as the smallest possible radial temperature gradient is advantageously provided.

FIG. 3A shows a schematic representation of a second crystal growing unit according to the invention. The beaker-shaped first thermal insulation 5 encloses the crucible as well as the second thermal insulation 12 arranged over the whole surface above the crucible cover. The second crystal growing unit according to the invention has a lateral heat source in the form of an induction-heating unit 6. The induction power generated by means of the induction-heating unit 6 is absorbed in the crucible side wall. For this, the crucible is formed of a conductive material, e.g. graphite. The induction-heating unit 6 thus brings about a heating of the crucible side wall by means of induction. The heating of the crucible side wall generates a heat flow 8 with a radial component from the crucible side wall into the crucible interior. By providing the second thermal insulation 12, the heat flow 8 is guided, in the crucible interior, in an axial direction through the growing single crystal 4. As a result, the isotherms 7 at the crystal growth front are slightly convex, viewed from the source material 2. The growth boundary surface of the growing single crystal 4 forming along an isotherm 7 thus also adopts a slightly convex shape. As a result, favorable conditions for the growth of the single crystal 4 prevail.

FIG. 3B shows a schematic representation of a third crystal growing unit according to the invention. In addition to the second crystal growing unit according to the invention, a susceptor 31 with a material-free area 32 is arranged between the crucible side wall and the first thermal insulation 5. The susceptor 31 serves for the primary absorption of the induction power generated by means of the induction-heating unit 6. The susceptor 31 is formed, for example, of graphite. The material-free area 32 contains a vacuum or a gas, for example. By providing the susceptor 31, the absorption of the induction power is improved.

FIG. 3C shows a schematic representation of a fourth crystal growing unit according to the invention. The fourth crystal growing unit according to the invention has a lateral heat source in the form of a resistance-heating unit 9. The resistance-heating unit 9 has a material-free area 32 and surrounds the crucible side wall. In the example shown, the resistance-heating unit 9 completely surrounds the crucible side wall. The beaker-shaped first thermal insulation 5 encloses the crucible together with the resistance-heating unit 9 as well as the second thermal insulation 12 arranged over the whole surface above the crucible cover. The resistance-heating unit 9 brings about a heating of the crucible side wall. The heating of the crucible side wall generates a heat flow 8 with a radial component from the crucible side wall into the crucible interior. As already explained above, by providing the second thermal insulation 12, the heat flow 8 is guided, in the crucible interior, in an axial direction through the growing single crystal 4. As a result, the isotherms 7 at the crystal growth front are slightly convex, viewed from the source material 2. The growth boundary surface of the growing single crystal 4 forming along an isotherm 7 thus also adopts a slightly convex shape. As a result, favorable conditions for the growth of the single crystal 4 prevail.

FIG. 3D shows a schematic representation of a fifth crystal growing unit according to the invention. The fifth crystal growing unit according to the invention has any desired lateral heat source 13. The fifth crystal growing unit according to the invention can therefore be identical to the second, third or fourth crystal growing unit according to the invention. The lateral heat source 13 is therefore identified merely schematically by an altered representation of the crucible side wall. In particular, the lateral heat source 13 can be a combination of the induction-heating unit 6 discussed in the context of the second crystal growing unit according to the invention and the resistance-heating unit 9 discussed in the context of the fourth crystal growing unit according to the invention. Furthermore, the lateral heat source 13 can be a combination of the induction-heating unit 6 with susceptor 31 discussed in the context of the third crystal growing unit according to the invention and the resistance-heating unit 9 discussed in the context of the fourth crystal growing unit according to the invention. In each case, the advantages correspondingly mentioned above result.

FIG. 3E shows a schematic representation of a sixth crystal growing unit according to the invention. The sixth crystal growing unit according to the invention has any desired lateral heat source 13 and, in this aspect, corresponds to the second to fifth crystal growing units according to the invention. With respect to the features present and advantages achieved therewith, reference is therefore made to the comments regarding the second to fifth crystal growing units according to the invention. In addition, the sixth crystal growing unit according to the invention has a lower heat source 11 arranged below the crucible base of the crucible. In the example shown, the lower heat source 11 is arranged over the whole surface below the crucible base. The beaker-shaped first thermal insulation 5 thus encloses the lower heat source 11, the crucible optionally surrounded by a resistance-heating unit and/or a susceptor 31 as well as the second thermal insulation 12 arranged over the whole surface above the crucible cover. The lower heat source 11 can in particular be realized as resistance heater. By providing the lower heat source 11, the axial component of the heat flow 8 through the crucible and through the growing single crystal 4 is strengthened. The lower heat source 11 thus cooperates, together with the second thermal insulation 12, in the creation of a heat flow 8 in an axial direction. The additional lateral heat source 13 and the heating of the crucible side wall brought about therewith generate a slight radial component of the heat flow 8 from the crucible side wall into the crucible interior. As a result, the isotherms 7 at the crystal growth front are slightly convex, viewed from the source material 2. The growth boundary surface of the growing single crystal 4 forming along an isotherm 7 thus also adopts a slightly convex shape. As a result, particularly favorable conditions for the growth of the single crystal 4 prevail.

FIG. 3F shows a schematic representation of a seventh crystal growing unit according to the invention. The seventh crystal growing unit according to the invention corresponds to the sixth crystal growing unit according to the invention and additionally has a first 14 and a second optical pyrometer access 15. The first optical pyrometer access 14 passes through the second thermal insulation 12 and thereby makes a pyrometric measurement of the temperature of the crucible cover from above possible. The second optical pyrometer access 15 passes through the first thermal insulation 5 as well as the lower heat source 11 and thereby makes a pyrometric measurement of the temperature of the crucible base from below possible. The first 14 and/or the second optical pyrometer access 15 preferably run along the axis of symmetry of the crucible.

FIG. 4 shows a schematic representation of an eighth crystal growing unit according to the invention. The eighth crystal growing unit according to the invention corresponds to the seventh crystal growing unit according to the invention. Unlike the latter, however, the second thermal insulation 12 is not arranged over the whole surface above the crucible cover. In the example shown, the cylindrical second thermal insulation 12 has a diameter of 100% of the diameter 17 of the useful area of the single crystal 4, i.e. of 100% of the diameter of the single crystal planned as product. In another example, the second thermal insulation 12 can have a diameter of 80% of the external diameter 16 of the crucible. In the case of the eighth crystal growing unit according to the invention, the first thermal insulation 5 encroaches on the area lying above the annular surface of the crucible cover lying radially on the outside and not covered by the second thermal insulation 12, with the result that the second thermal insulation 12 is directly surrounded by the first thermal insulation 5. By adapting the diameter of the second thermal insulation 12, the strength of the heat flow 8 or the axial temperature gradient from the crucible can advantageously be set. The eighth crystal growing unit according to the invention, like the sixth or the seventh crystal growing unit according to the invention, can additionally have a lower heat source 11. The reference number 10 is inserted—as well as in the following figures—as representative of any desired heat sources. The reference number 10 indicates that lower heat sources 11 and/or lateral heat sources 13 can be provided. Furthermore, the reference number 10 comprises induction-heating units and/or resistance-heating units.

FIG. 5A shows a schematic representation of a ninth crystal growing unit according to the invention. The ninth crystal growing unit according to the invention additionally has a cavity 18 arranged between the crucible cover and the second thermal insulation 12. The cavity 18 is therefore delimited at the top by the lower surface 19 of the second thermal insulation 12, at the bottom by the upper surface 20 of the crucible cover and at the side by the inner surface 21 of the first thermal insulation 5. The surfaces 19, 20, 21 adjoining the cavity 18 are designed such that they have an adapted emissivity ε or different adapted emissivities ε. In the example shown, the surfaces 19, 20, 21 have the same adapted emissivity ε. For this, the surfaces 19, 20, 21 are provided with a coating of low emissivity ε, e.g. with TaC with an emissivity ε of approximately 0.3. The coating in particular of the surface 19 of the second thermal insulation 12 and of the surface 20 of the crucible cover has a particularly strong effect on the axial temperature gradient in the cavity 18. The application of coatings with low emissivity ε results in an increased axial temperature gradient in the cavity 18. An increased axial temperature gradient in the cavity 18 is physically accompanied by a reduced heat flow 8 from the crucible. In total, this results in the fact that the same thermal conditions can be achieved in the crucible interior as it is possible to do if the coating of the surfaces 19, 20, 21 adjoining the cavity 18 is dispensed with, but with a heat output which is 10% to 20% lower. In this way, the coating can be utilized to save electrical energy.

In a modification not shown here, the cavity 18 can be delimited at the side by a hollow graphite cylinder and/or at the top by a graphite disk. These graphite components provide the cavity 18 with a greater mechanical stability. The thickness of the graphite components can be 10 mm. The graphite components can in turn be provided with a coating of low emissivity ε, e.g. with TaC with an emissivity ε of approximately 0.3. Thus, the above-mentioned advantages also result.

Moreover, the ninth crystal growing unit according to the invention can be embodied like the first to eighth crystal growing units according to the invention. In particular, the ninth crystal growing unit according to the invention, like the sixth or the seventh crystal growing unit according to the invention, can have a lower heat source 11.

FIG. 5B shows a schematic representation of a tenth crystal growing unit according to the invention. The tenth crystal growing unit according to the invention corresponds to the ninth crystal growing unit according to the invention and additionally has a relief 22 on the surface 20 of the crucible cover facing the cavity 18. As explained above, this surface can also be adapted in terms of its emissivity ε, for example by a coating. In particular, it can be provided with a coating with low emissivity ε, e.g. with TaC with an emissivity ε of approximately 0.3.

Beyond the setting of the axial temperature gradient through variation of the emissivity ε of the surfaces 19, 20, 21, the embossing of a relief makes it possible to influence the direction of the thermal radiation and thus the radial temperature gradient within the cavity. For this, the direction of the heat flow in the cavity 18 is indicated with the reference number 23 in FIG. 5B. The direction of the heat flow 23 in the cavity 18 is tilted slightly radially inwards from the axial direction through the influence of the relief 22. Thus, the temperature field in the crucible, in particular in the area of the growing single crystal 4, is also influenced to a small degree. This is important for the fine-tuning of the temperature field in the crucible. A small radial temperature gradient with associated slightly convex isotherms can thereby be set in a defined manner at the crystal growth front. The temperature field starting from a radial temperature gradient close to 0 K/cm can thereby be prevented from inadvertently changing into slightly concave isotherms at the crystal growth front through unintended variations in the material properties or geometries of the graphite parts used, which would result in the massive incorporation of crystal defects. Advantageously, by providing slightly convex isotherms at the crystal growth front, the crystal growth can thus be stabilized at a low crystal defect density.

FIG. 6 shows a schematic representation of an eleventh crystal growing unit according to the invention. The eleventh crystal growing unit according to the invention corresponds to the ninth or tenth crystal growing unit according to the invention and additionally has a nucleus cavity. For this, the single crystal 4 is arranged with the aid of a nucleus suspension device 24 in such a way that the nucleus cavity is formed within the crucible between the single crystal 4 and the crucible cover. The nucleus suspension device 24 can be formed of graphite. The crystal nucleus suspended in the nucleus suspension device 24, from which the single crystal 4 develops through adsorption, is denoted with the reference number 25. By providing the nucleus suspension device 24, the growing single crystal 4 is mechanically separated from the crucible material. As a result, thermally induced mechanical stresses in the single crystal 4 due to the different thermal expansion coefficients of the single crystal 4 and the crucible formed of graphite or the conventional nucleus carrier generally formed of dense graphite can be prevented.

FIGS. 7A to 7C show enlarged detail views with various embodiments of the eleventh crystal growing unit according to the invention. The nucleus cavity is delimited at the bottom by the upper surface 26 of the crystal nucleus 25 or the single crystal 4, at the top by the lower surface 27 of the crucible cover and at the side by the inner surface 28 of the nucleus suspension device 24. The surfaces 26, 27, 28 adjoining the nucleus cavity are designed such that they have an adapted emissivity ε or different adapted emissivities ε. In the example shown, the upper surface 26 of the crystal nucleus 25 or the single crystal 4 adjoining the nucleus cavity and the lower surface 27 of the crucible cover adjoining the nucleus cavity have the same adapted emissivity ε. For this, the surfaces 26, 27 are provided with a coating of low emissivity ε, e.g. with TaC with an emissivity ε of approximately 0.3. In addition, the inner surface 28 of the nucleus suspension device 24 adjoining the nucleus cavity can also have the same adapted emissivity ε and in particular be provided with a coating of low emissivity ε, e.g. with TaC with an emissivity ε of approximately 0.3. The coating in particular of the upper surface 26 of the crystal nucleus 25 or the single crystal 4 and of the lower surface 27 of the crucible cover has an effect on the axial temperature gradient in the nucleus cavity. The application of coatings with low emissivity ε results in an increased axial temperature gradient in the nucleus cavity. An increased axial temperature gradient in the nucleus cavity results in a higher supersaturation of the growth species at the growth front of the growing single crystal 4. Such a supersaturation is advantageous in the production of SiC with a cubic polytype, i.e. in the production of 3C—SiC.

In an alternative embodiment, the upper surface 26 of the crystal nucleus 25 or the single crystal 4 adjoining the nucleus cavity and the lower surface 27 of the crucible cover adjoining the nucleus cavity are provided with a coating with high emissivity ε, e.g. with C with an emissivity ε of approximately 0.9. The application of coatings with high emissivity ε results in a reduced axial temperature gradient in the nucleus cavity. A reduced axial temperature gradient in the nucleus cavity results in a low supersaturation of the growth species at the growth front of the growing single crystal 4. That is advantageous in the production of SiC with a hexagonal polytype, for example in the production of 6H—SiC and in particular in the production of 4H—SiC.

Depending on the coating of the surfaces 26, 27 adjoining the nucleus cavity, the heat can thus be dissipated to different extents. The heat flow directed out of the crucible can thereby be set precisely.

In the embodiment represented in FIG. 7B, a further relief 29 is additionally provided on the lower surface 27 of the crucible cover adjoining the nucleus cavity. This influences the radial temperature gradient. A small radial temperature gradient with associated slightly convex isotherms can thereby be set in a defined manner at the crystal growth front of the growing single crystal 4. The temperature field starting from a radial temperature gradient close to 0 K/cm can thereby be prevented from inadvertently changing into slightly concave isotherms at the crystal growth front through unintended variations in the material properties or geometries of the graphite parts used, which would result in the massive incorporation of crystal defects. Advantageously, by providing slightly convex isotherms at the crystal growth front, the crystal growth can thus be stabilized at a low crystal defect density.

In the embodiment represented in FIG. 7C, a nucleus cavity filling 30 is additionally provided in the nucleus cavity. In the example shown, the nucleus cavity is completely filled with the nucleus cavity filling 30. The nucleus cavity filling 30 is a temperature-stable solid material which is chemically inert with respect to SiC, e.g. a SiC powder. The nucleus cavity filling 30 is provided in such a way that it does not hinder the transporting of heat away from the single crystal 4 to the crucible cover. By providing the nucleus cavity filling 30, a further possibility is advantageously provided to guarantee a defined transporting away of the heat of crystallization.

FIG. 8 shows a schematic three-dimensional view of a second thermal insulation as a series of five sheets 33. The crucible located below the series of sheets 33 is not represented here. The sheets 33 in each case have a thickness of 2 mm, for example. Adjacent sheets 33 have a spacing of 10 mm, for example. The sheets 33 are formed of a material with high temperature stability, e.g. graphite.

Each individual sheet 33 preferably reflects the highest possible proportion of the thermal radiation 34 incident on it and preferably transmits the lowest possible proportion of the thermal radiation 34 incident on it. The sheets 33 therefore act as radiation shields. The transmitted thermal radiation 34 decreases from sheet 33 to sheet 33. Correspondingly, a much lower temperature prevails above the series of sheets 33 than below the series of sheets 33.

The strength of the thermal insulation is substantially determined by the number of sheets 33 and the respective emissivity of the surfaces of the sheets 33.

The crucible is preferably operated in a temperature range of from T=1500° C. to 2500° C. In this temperature range, heat transfer by thermal radiation dominates. In order to obtain the same high-temperature insulation of a graphite foam or graphite felt in this temperature range with the aid of the arrangement of several sheets 33, the following are for example suitable:

Three to five sheets with an emissivity of 0.3 on both sides. For this, the sheets 33 are e.g. made of graphite with a TaC coating or of TaC.

Five to eight sheets with an emissivity of 0.7 on both sides. For this, the sheets 33 have e.g. a shiny graphite surface.

For this, various variations are possible. The emissivity of successive sheets 33 can vary. The upper side and the underside of one sheet 33 or several sheets 33 can differ in terms of the emissivity.

FIG. 9 shows a central two-dimensional section through the series, shown in FIG. 8, of five sheets 33 in a first embodiment. Here, the sheets 33 are spaced apart from each other by spacers arranged in a radially outer area of the sheets 33. The spacers are designed as thin pins 35.

FIG. 10A shows a central two-dimensional section through the series, shown in FIG. 8, of five sheets in a second embodiment. Here too, the sheets 33 are spaced apart from each other by spacers arranged in a radially outer area of the sheets 33. The spacers are implemented as rings 36 in this embodiment. For this, in each case one ring 36 and one sheet 33 are arranged alternately one on top of the other. FIG. 10B shows a central two-dimensional section through the series, shown in FIG. 8, of five sheets in a third embodiment. Here, the sheets 33 engage, with a radially outer area, in receiving grooves 37 of an annular receiving body 38. The rings 36 and the receiving body 38 are preferably made from thermally insulating material, for example graphite foam or felt.

FIG. 11 shows schematic representations of sheets in each case provided with elongate incisions 39. The incisions 39 in each case run in a radial direction starting from an outer circumference of the sheets 33. The incisions 39 do not penetrate into a radially inner area of the sheets and therefore do not meet. The sheets 33 in each case have twelve incisions 39 in each case with an angular spacing of 30° with respect to each other. The sheets 33 shown as (a) and (b) are turned by 15° with respect to each other. As a result, in the case of the arrangement of the sheets 33, shown in (a) and (b), carried out in (c) so that they lie one on top of the other, the incisions 39 are offset with respect to each other.

By providing the incisions 39, the inductive coupling of induction power into the sheets 33 can advantageously be prevented or at least greatly reduced. A possibly interfering vertical radiation of heat through the incisions 39 can be suppressed through the turned vertical arrangement.

LIST OF REFERENCE NUMBERS

1 crucible wall
2 source material
3 gas space
4 single crystal
5 first thermal insulation
6 induction-heating unit
7 isotherm
8 heat flow
9 resistance-heating unit
10 any desired heat source
11 lower heat source
12 second thermal insulation
13 lateral heat source
14 first optical pyrometer access
15 second optical pyrometer access
16 external diameter of the crucible
17 diameter of the useful area of the single crystal
18 cavity
19 lower surface of the second thermal insulation
20 upper surface of the crucible cover
21 inner surface of the first thermal insulation
22 relief
23 direction of the heat flow in the cavity
24 nucleus suspension device
25 crystal nucleus
26 upper surface of the crystal nucleus or the single crystal
27 lower surface of the crucible cover
28 inner surface of the nucleus suspension device
29 further relief
30 nucleus cavity filling

31 susceptor
32 material-free area
33 sheet
34 thermal radiation
35 pin
36 ring
37 receiving groove
38 receiving body
39 incision

The invention claimed is:

1. A crystal growing unit comprising a crucible for producing and/or enlarging a single crystal, wherein the crystal growing unit has a first thermal insulation with a first thermal conductivity and a second thermal insulation with a second thermal conductivity, wherein the crucible has a crucible base, a crucible side wall and a crucible cover, wherein the crucible side wall is indirectly or directly surrounded by the first thermal insulation, wherein the second thermal insulation is arranged indirectly or directly above the crucible cover, wherein the second thermal conductivity is greater than the first thermal conductivity, wherein the second thermal conductivity lies in a range of from 2 to 50 W/(m*K) at room temperature, wherein the crystal growing unit comprises a cavity arranged between the crucible cover and the second thermal insulation, wherein the surface of the crucible cover adjoining the cavity has a predetermined relief, and wherein the second thermal insulation is arranged over the whole surface above the crucible cover.

2. The crystal growing unit according to claim 1, wherein a source material provided in the crucible can be heated, evaporated and deposited, and wherein the source material comprises SiC.

3. The crystal growing unit according to claim 1, wherein the first thermal insulation is arranged indirectly or directly below the crucible base.

4. The crystal growing unit according to claim 1, wherein the first thermal conductivity lies in a range of from 0.05 to 5 W/(m*K) or the second thermal conductivity lies in a range of from 5 to 20 W/(m*K).

5. The crystal growing unit according to claim 1, wherein at least one of (1) the surface of the first thermal insulation adjoining the cavity has a predetermined first emissivity (ε), (2) the surface of the second thermal insulation adjoining the cavity has a predetermined second emissivity (ε), or (3) the surface of the crucible cover adjoining the cavity has a predetermined third emissivity (ε); and wherein at least one of the first, second or third emissivity (ε) is set in a range of between 0.05 and 0.5.

6. The crystal growing unit according to claim 1, wherein at least one of the following has a predetermined relief: the surface of the first thermal insulation adjoining the cavity, or the surface of the second thermal insulation adjoining the cavity.

7. The crystal growing unit according to claim 1, wherein the single crystal is arranged with the aid of a nucleus suspension device, and wherein the crystal growing unit comprises a nucleus cavity arranged within the crucible between the single crystal and the crucible cover.

8. The crystal growing unit according to claim 7, wherein at least one of (1) the surface of the nucleus suspension device adjoining the nucleus cavity has a predetermined fourth emissivity (8), (2) the surface of the crucible cover adjoining the nucleus cavity has a predetermined fifth emissivity (ε), or (3) the surface of the single crystal adjoining the nucleus cavity has a predetermined sixth emissivity (ε).

9. The crystal growing unit according to claim 8, wherein at least one of the following has a predetermined relief: (1) the surface of the crucible cover adjoining the nucleus cavity, (2) the surface of the nucleus suspension device adjoining the nucleus cavity, or (3) the surface of the single crystal adjoining the nucleus cavity.

10. The crystal growing unit according to claim 7, wherein the nucleus cavity is filled with a solid material, wherein the solid material is at least one of (1) SiC powder, (2) a polycrystalline or monocrystalline SiC crystal, or (3) porous or solid graphite.

11. The crystal growing unit according to claim 1, wherein the crystal growing unit comprises a heating device for heating the crucible, wherein the heating device comprises at least one of an induction-heating unit or a resistance-heating unit.

12. The crystal growing unit according to claim 11, wherein the heating device is arranged between the crucible base and the first thermal insulation or between the crucible side wall and the first thermal insulation.

13. The crystal growing unit according to claim 1, wherein the crystal growing unit comprises at least one of (1) a first pyrometer access, or (2) a second pyrometer access, and wherein (1) the first pyrometer access penetrates the second thermal insulation up to the crucible cover, (2) the second pyrometer access penetrates the first thermal insulation, or (3) the second pyrometer access penetrates the heating device up to the crucible base.

14. The crystal growing unit according to claim 1, wherein the first thermal insulation is arranged indirectly or directly above a radially outer annular surface of the crucible cover.

15. The crystal growing unit according to claim 1, wherein at least one of the crucible base, the crucible side wall, or the crucible cover of the crucible is formed of at least one of (1) graphite, (2) TaC, or (3) coated graphite.

16. The crystal growing unit according to claim 1, wherein the source material in the crucible can, depending on temperature gradients, be at least one of (1) evaporated, (2) transported, or (3) deposited, and wherein the temperature gradients can be set in a targeted manner in the crucible.

17. The crystal growing unit according to claim 1, wherein the crystal growing unit is formed for the targeted setting of temperature gradients in the crucible, wherein the temperature gradients can be set through the design of at least one of the first thermal insulation or the second thermal insulation in such a way that the isotherms have a convex progression.

18. The crystal growing unit according to claim 1, wherein the temperature gradients in the crucible can be set by the heating device.

19. The crystal growing unit according to claim 1, wherein at least one of (1) the first thermal insulation comprises graphite felt or graphite foam, or (2) the second thermal insulation comprises graphite foam or porous graphite.

20. The crystal growing unit according to claim 1, wherein the second thermal insulation (is formed of a series of several sheets spaced apart from each other in each case.

21. The crystal growing unit according to claim 20, wherein the second thermal insulation is formed of from two to ten sheets.

22. The crystal growing unit according to claim 20, wherein the sheets are formed of at least one of graphite, coated graphite, or metal carbide.

23. The crystal growing unit according to claim 20, wherein the sheets in each case have a thickness of between 0.1 and 10 mm.

24. The crystal growing unit according to claim 20, wherein successive sheets in each case have a spacing in the range of from 1 to 50 mm.

25. The crystal growing unit according to claim 20, wherein the sheets have, at their surfaces, an emissivity of at most 0.4 or an emissivity of at least 0.6.

26. The crystal growing unit according to claim 25, wherein the emissivities of successive sheets differ.

27. The crystal growing unit according to claim 20, wherein the sheets in each case have several elongate incisions.

28. A method for producing and/or enlarging a single crystal by heating, evaporating and depositing a source material in a crucible of a crystal growing unit, wherein the source material is, depending on temperature gradients, at least one of (1) evaporated, (2) transported, or (3) deposited, wherein the temperature gradients are set in a targeted manner, wherein the crucible has a crucible base, a crucible side wall and a crucible cover, wherein the crucible side wall is indirectly or directly surrounded by a first thermal insulation with a first thermal conductivity, wherein a second thermal insulation with a second thermal conductivity is arranged indirectly or directly above the crucible cover, wherein the second thermal conductivity is greater than the first thermal conductivity, wherein the second thermal conductivity lies in a range of from 2 to 50 W/(m*K) at room temperature, wherein the temperature gradients are set through the design of at least one of the first thermal insulation or the second thermal insulation in such a way that the isotherms have a convex progression, wherein the crystal growing unit comprises a cavity arranged between the crucible cover and the second thermal insulation, wherein the surface of the crucible cover adjoining the cavity has a predetermined relief, and wherein the second thermal insulation is arranged over the whole surface above the crucible cover.

* * * * *